United States Patent [19]
Nagaoka

[11] Patent Number: 5,973,533
[45] Date of Patent: Oct. 26, 1999

[54] SEMICONDUCTOR GATE CIRCUIT HAVING REDUCED DEPENDENCY OF INPUT/OUTPUT CHARACTERISTICS ON POWER SUPPLY VOLTAGE

[75] Inventor: Hideaki Nagaoka, Hyogo, Japan

[73] Assignee: Mitsubishi Denki Kabushiki Kaisha, Tokyo, Japan

[21] Appl. No.: 09/016,433

[22] Filed: Jan. 30, 1998

[30] Foreign Application Priority Data

Jul. 29, 1997 [JP] Japan ..................................... 9-203132

[51] Int. Cl.⁶ ....................................................... H03K 3/01
[52] U.S. Cl. ........................... 327/263; 327/264; 327/544
[58] Field of Search ................................... 327/261, 262, 327/263, 264, 276, 278, 281, 544; 365/226, 227

[56] References Cited

U.S. PATENT DOCUMENTS

| 5,376,840 | 12/1994 | Nakayama | 327/537 |
| 5,541,885 | 7/1996 | Takashima | 365/226 |
| 5,726,946 | 3/1998 | Yamagata et al. | 365/226 |

FOREIGN PATENT DOCUMENTS 05014148A  1/1993  Japan .
08018413A  1/1996  Japan .

*Primary Examiner*—Tuan T. Lam
*Attorney, Agent, or Firm*—McDermott, Will & Emery

[57] ABSTRACT

In a semiconductor gate circuit, an MOS transistor having a low threshold voltage and a standard MOS transistor having threshold voltages of large absolute values are connected in series between an output node and a power supply node. The MOS transistor having the threshold voltage of the large absolute value receives on a gate thereof, a signal preceding in phase a signal applied to a gate of the MOS transistor having the small threshold voltage. In the semiconductor gate circuit, a dependency of input/output characteristics on a power supply voltage is small, and a leak current during standby is reduced. The standard MOS transistor turns on prior to turning on of the low threshold voltage MOS transistor, and turns off when the low threshold voltage MOS transistor turns off. The output node driving current is controlled by the low threshold voltage MOS transistor while a subthreshold leak current is suppressed by the standard transistor. A gate circuit having a small dependency of an input/output characteristics on the power supply voltage is implemented without increasing the power consumption.

18 Claims, 22 Drawing Sheets

TIME DIFFERENCE IN TURNING ON BETWEEN STANDARD MOS & LOW-Vth MOS

TIME

FIG. 2A   FIG. 2B   FIG. 2C
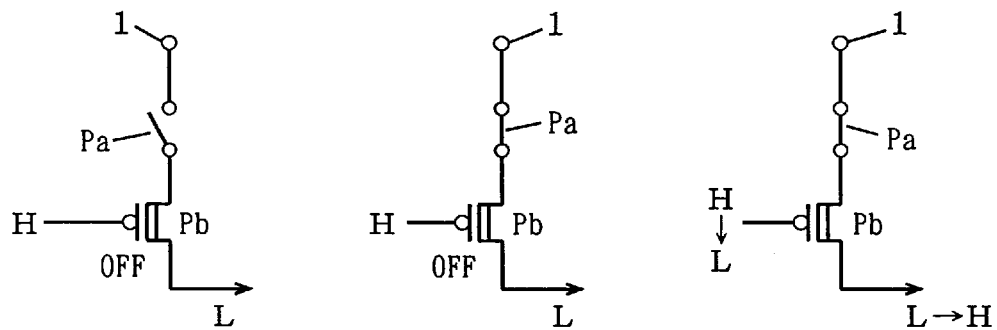
FIG. 3
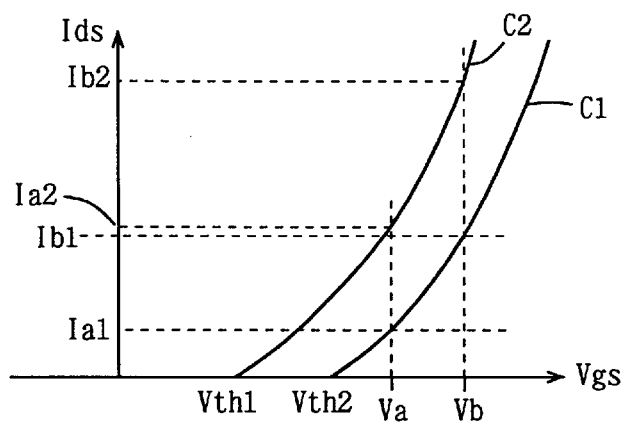
FIG. 4

SEMICONDUCTOR GATE CIRCUIT HAVING REDUCED DEPENDENCY OF INPUT/ OUTPUT CHARACTERISTICS ON POWER SUPPLY VOLTAGE

BACKGROUND OF THE INVENTION

1. Field of the Invention

The present invention relates to a semiconductor gate circuit for effecting a predetermined processing on an applied signal for outputting, and in particular to a buffer circuit or a delay circuit in which rising and falling times of an output signal or a delay time thereof has a reduced dependency on a power supply voltage.

2. Description of the Background Art

Portable information equipments have recently been widely used. Many portable information equipments use batteries as their power sources. Therefore, elements used in such a portable information equipment are required to operate fast for a long time with a small number of batteries. In a semiconductor device, however, if the power supply voltage is simply lowered for reducing the power consumption without changing a conventional circuit structure, a current driving capability of a MOS transistor (insulated gate field-effect transistor) abruptly lowers, and therefore an operation speed of the element significantly lowers. This results in significant increase in an access time, if the semiconductor device is a memory. In order to suppress lowering of the current driving capability, it is necessary to reduce an absolute value of a threshold voltage of the MOS transistor in accordance with lowering of the power supply voltage so that the operation speed of the MOS transistor may not lower even with a low power supply voltage. In the case of a low power consumption SRAM (Static Random Access Memory), however, there is a strict restriction on a current during standby (that a standby current must be about 1 $\mu A$), so that even a leak current alone which flows through an off state MOS transistor exceeds a specification value if measures other than reduction in absolute value of the threshold voltage are not employed. This is due to a subthreshold current of the MOS transistor. The subthreshold current is a current which flows when Et gate to source voltage lowers to or below the threshold voltage (in the case of the n-channel MOS transistor).

FIG. 43 shows a relationship between a gate-source voltage Vgs and a drain current Ids in a subthreshold region of an n-channel MOS transistor. In FIG. 43, the abscissa gives gate-source voltage Vgs, and the ordinate gives, on a logarithmic scale, the drain current Ids. The subthreshold region is a region in which curves S1 and S2 extend straight. The drain current exponentially lowers in accordance with a difference between the gate voltage and the threshold voltage. Threshold voltage Vth of the MOS transistor is defined as a gate-source voltage which causes flow of a predetermined current Ith in a MOS transistor having a predetermined gate width. Therefore, the MOS transistor having drain current characteristics represented by curve Si in FIG. 43 has the threshold voltage of Vtha. If the threshold voltage of MOS transistor is lowered from Vtha to Vthb, characteristics represented by curve S2 is obtained. When the MOS transistor is off, the gate-source voltage Vgs is 0V, and a current I0 flows in the MOS transistor having threshold voltage Vtha, while a current I1 flows in the MOS transistor having threshold voltage Vthb. In the n-channel MOS transistor, therefore, the leak current (subthreshold current) in the off state increases with decrease in threshold voltage. For example, when threshold voltage Vth lowers by 0.3 V, the leak current of the MOS transistor increases 1000 times, resulting in flow of a leak current larger than the standby leak current prescribed in the specification.

In an inverter buffer using MOS transistors, if a only standard MOS transistors, i.e., MOS transistors having threshold voltages of ordinary absolute values are employed, the current consumption during standby can be reduced, but rising and falling times of an output signal increase during an operation with a low power supply voltage due to lowering of the current driving capability of the MOS transistors during the operation with the low power supply voltage. This impairs the input/output characteristics. Particularly in a delay circuit formed of a plurality of cascaded inverter buffers, a dependency of a delay time on the power supply voltage increases during the operation with the low power supply voltage, so that it is impossible to change internal signals at desired timings. For use with a low power supply voltage, therefore, a semiconductor gate circuit such as an inverter buffer or a delay circuit is required to satisfy the following two conditions.

1. A drive current value is determined by a low-Vth transistor, i.e., a MOS transistor of which threshold voltage is reduced in absolute value in accordance with lowering of the power supply voltage and of which current driving capability does not significantly lower even with a low power supply voltage.

2. During standby, a leak current hardly flows. Thus, a standard MOS transistor is necessarily arranged at every current path, and this MOS transistor is held in the off state during standby.

FIG. 44 shows an example of a structure of a conventional delay circuit which has been devised to satisfy the foregoing two conditions. In FIG. 44, the delay circuit includes four cascaded inverters IV1, IV2, IV3 and IV4. Each of inverters IV1–IV4 operates receiving as operation power supply voltages a power supply voltage on a power supply node 1 and a ground voltage on a ground node 2. Each of inverters IV1–IV4 includes a p-channel MOS transistor PQL and an n-channel MOS transistor NQL which are connected in series between power supply node 1 and a common node 3 and each receive on its gate an input signal IN or an output signal of the inverter at the immediately preceding stage. MOS transistors PQL and NQL have threshold voltages of small absolute values, respectively.

The delay circuit includes an n-channel MOS transistor NQS, which is selectively turned on in response to control signal φACT, and thereby electrically connects common node 3 to ground node 2. This MOS transistor NQS is a standard MOS transistor having threshold voltage larger in absolute value than threshold voltages of MOS transistors PQL and NQL. Control signal φACT specifies a standby cycle and an active cycle in a semiconductor device using this delay circuit. An operation of the delay circuit shown in FIG. 44 will be described below with reference to a signal waveform diagram shown in FIG. 45. During standby, control signal φACT is at the ground voltage level or L-level, and MOS transistor NQS is off. Thereby, common node 3 is electrically isolated from ground node 2.

MOS transistor NQS has a high threshold voltage, and therefore hardly causes a leak current flowing from common node 3 to ground node 2. In this standby cycle, input signal IN maintains a certain logical level. FIG. 45 shows a signal waveform in the case that input signal IN is fixed to H-level. When input signal IN is at H-level, p- and n-channel MOS transistors PQL and NQL in inverter IV1 are off and on, respectively. In this state, a leak current flows from power supply node 1 to common node 3 through p- and n-channel MOS transistors PQL and NQL. However, MOS transistor NQS is off, so that the leak current flowing into common node 3 does not flow to ground node 2.

In this standby cycle, output signal OUT is held at H-level because the potential on common node 3 rises by the leak current. When input signal IN is at L-level, MOS transistors PQL and NQL in inverter IV1 are on and off, respectively. However, output signal OUT is held at H-level because the leak current likewise flows.

In the active cycle, input signal IN changes in accordance with an operations of another circuit or an externally applied signal. In this active cycle, control signal φACT is set to the power supply voltage level, i.e., H-level, and MOS transistor NQS is on, so that common node 3 is electrically connected to ground node 2, and common node 3 attains the ground voltage level. In accordance with change of input signal IN from H-level to L-level, output signal OUT falls from H-level to L-level after elapsing of a delay time TD determined by inverters IV1–IV4. When input signal IN rises from L-level to H-level, output signal OUT rises from L-level to H-level after elapsing of a delay time TD'.

When the delay circuit shown in FIG. 44 is used, the operation is performed as follows. While this delay circuit is in a standby state, common node 3 is electrically isolated from ground node 2, so that there is no current path from power supply node 1 to ground node 2. Therefore, leak current IL during standby can be sufficiently suppressed even if low-Vth MOS transistors are used in the inverter circuits. In the active cycle, since common node 3 is set to the ground voltage level, low-Vth MOS transistors PQL and NQL in each of inverters IV1–IV4 are on and off complementarily, so that, even with the low power supply voltage, the output node can be driven with a current driving capability of a magnitude similar to that under a normal power supply voltage, and output signal OUT can be changed in accordance with input signal IN at high speed.

FIG. 46 schematically shows an arrangement of delay circuits in a conventional semiconductor device. In FIG. 46, a semiconductor device SD includes delay circuits DL1, DL2 and DL3 arranged dispersedly. Delay circuits DL1, DL2 and DL3 delay signals φ1, φ2 and φ3 for outputting the same, respectively. Each of delay circuits DL1–DL3 has the same structure as that shown in FIG. 44. However, delay circuits DL1–DL3 may have different delay times, respectively. Delay circuits DL1–DL3 are dispersed to occupy optimum positions in the device in accordance with contents of processing, i.e., signals φ1–φ3 applied thereto, respectively.

Control signal generating circuit CG generating control signal φACT must apply control signal φACT to each of delay circuits DL1–DL3. Therefore, a signal line SGL arranged between control signal generating circuit CG and delay circuits DL1–DL3 extends over a long distance in semiconductor device SD, so that signal line SGL has a large interconnection resistance and a large parasitic capacitance. Therefore, control signal φACT changes slowly, and delay circuits DL1–DL3 cannot be driven fast, so that response of delay circuits DL1–DL3 is slowed down during changes from the standby cycle to the active cycle and vice versa, which reduces an effect of reducing a current consumption. It is necessary to delay the operation start timings of delay circuits DL1–DL3 in accordance with a delay of control signal φACT, so that a fast operation cannot be achieved.

Control signal generating circuit CG must rapidly drive the gates of power-cut MOS transistors, i.e., MOS transistors for cutting off the power included in delay circuits DL1–DL3 as well as signal line SGL. This results in a problem that fast driving of the large load requires a large current consumption.

The above problem arises in not only the delay circuits but also a buffer circuit for buffering an applied signal. This is because an inverter buffer is achieved if only inverter IV1 at the initial stage in the delay circuit shown in FIG. 44 is employed.

SUMMARY OF THE INVENTION

An object of the invention is to provide a semiconductor gate circuit which has input/output characteristics having no dependency on a power supply voltage and can operate with a low current consumption.

Another object of the invention is to provide a buffer circuit, which has a small dependency of rising and falling times of an output signal on a power supply voltage and can operate with a low current consumption.

Still another object of the invention is to provide a delay circuit which has a reduced dependency of a delay time on a power supply voltage and can operate with a low current consumption.

Yet another object of the invention is to provide a semiconductor gate circuit, which performs predetermined processing in accordance with an applied signal, can have a leak current reduced in a standby cycle and no delay in timing of starting an operation of an internal circuit required in a active cycle.

According to a first aspect, a semiconductor gate circuit includes a plurality of cascaded inverters, at least one of the inverters including a first input node, a first output node, and first and second insulated gate field-effect transistors of a first conductivity type connected in series between a first power supply node supplying a voltage at a first logical level and the first output node. The first insulated gate field-effect transistor has a first threshold voltage. The second insulated gate field-effect transistor has a second threshold voltage smaller in absolute value than the first threshold voltage, and the first and second insulated gate field-effect transistors are turned on when a signal on the first input node is at a second logical level, and thereby form a current path between the first power supply node and the first output node for outputting a signal at the first logical level.

According to a second aspect, a semiconductor gate circuit includes at least one inverter arranged between an input node and an output node. The at least one inverter includes a first insulated gate field-effect transistor of a first conductivity type and a second insulated gate field-effect transistor of a second conductivity type arranged in series between the first and second nodes.

The semiconductor gate circuit of the second aspect further includes a control inverter for inverting a logic of a signal on the input node. The control inverter includes first and second control insulated gate field-effect transistors of the first and second conductivity types having threshold voltages larger in absolute value than threshold voltages of the first and second insulated gate field-effect transistors, respectively, and a circuit coupled to the first and second control insulated gate field-effect transistors for setting a speed of change of an output signal thereof from a second logical level to a first logical level to be lower than a speed of change from the first logical level to the second logical level.

The semiconductor gate circuit according to the second aspect further includes a third insulated gate field-effect transistor coupled between the first node and a first power supply node supplying a voltage at the first logical level, and having a threshold voltage larger in absolute value than the threshold voltages of the first and second insulated gate field-effect transistors of the first conductivity type receiving on their gate electrodes an output signal of the control inverter.

According to a third aspect, a semiconductor gate circuit includes first and second insulated gate field-effect transistors of a first conductivity type connected in series between a first power supply node and an output node. The first insulated gate field-effect transistor has a threshold voltage larger in absolute value than that of the second insulated gate field-effect transistor. The first insulated gate field-effect transistor has a current driving capability larger than that of the second insulated gate field-effect transistor under the condition of the same voltage between the gate electrode and the source electrode. The first and second insulated gate field-effect transistors have gate electrode nodes commonly coupled to the input node.

The insulated gate field-effect transistors having the different threshold voltages are connected in series between the power supply node and the output node. When the insulated gate field-effect transistor having the threshold voltage of the smaller absolute value is to be turned on to supply a current onto the output node, a current is supplied from the insulated gate field-effect transistor having the threshold voltage of the larger absolute value. A small difference is present in drive current quantity of the insulated gate field-effect transistor having the threshold voltage of the smaller absolute value, between the case of a high power supply voltage and the case of a low power supply voltage. Therefore, the output node can be driven without an influence by the power supply voltage, and the gate circuit can have input/output characteristics having a small dependency on the power supply voltage.

The insulated gate field-effect transistors of the large and small threshold voltages are connected in series. When it is not necessary to drive the output node, the insulated gate field-effect transistor having the threshold voltage of the larger absolute value is turned off, so that a leak current can be reduced, and it is possible to achieve the semiconductor gate circuit of a low standby current.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 2A, 2B and 2C are diagrams each representing an operation of the delay circuit shown in FIG. 1A;

FIG. 3 shows a dependency of input/output characteristics of the delay circuit shown in FIG. 1A on a power supply voltage;

FIG. 4 shows a relationship between a gate-source voltage and a drain current in a MOS transistor;

DESCRIPTION OF THE PREFERRED EMBODIMENTS

[Embodiment 1]

Figure 1A:
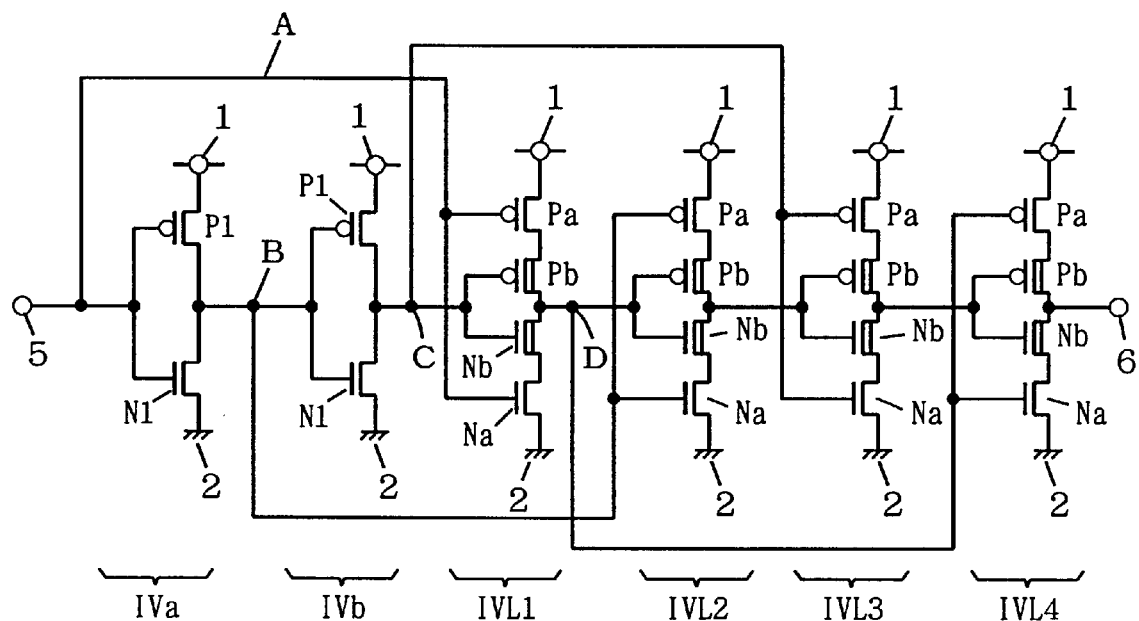
FIG. 1A shows a structure of a semiconductor gate circuit (delay circuit) according to an embodiment 1 of the invention.

FIG. 1A shows a structure of a semiconductor gate circuit according to an embodiment 1 of the invention. In FIG. 1A, a delay circuit is shown as the semiconductor gate circuit. The delay circuit delays a signal applied to an input node 5 and transmits the same onto an output node 6. This delay circuit includes a plurality of cascaded inverters IVa and IVb as well as IVL1–IVL4. Inverters IVa and IVb have the same structures and each include a p-channel MOS transistor P1 and an n-channel MOS transistor N1 connected in series between a power supply node 1 and a ground node 2. MOS transistors P1 and N1 have threshold voltages in absolute value within a range of, e.g., 0.7 to 0.8 V (if the power supply voltage is in a range of 1.5 to 2.5 V). In the following description, the MOS transistor of the threshold voltage of the larger absolute value will be referred to as a standard MOS transistor.

Inverter IVa inverts the signal applied onto input node 5 for transmission onto a node B. Inverter IVb inverts the signal on node B for transmission onto a node C.

Inverters IVI1–IVL4 have the same structures, and each includes p-channel MOS transistors Pa and Pb connected in series between the corresponding output node and power supply node 1, and n-channel MOS transistors Na and Nb connected in series between the corresponding output node and ground node 2. P-channel MOS transistor Pa and n-channel MOS transistor Na are standard MOS transistors. The absolute value of the threshold voltage of p-channel MOS transistor Pb is smaller than the absolute value of the threshold voltage of standard MOS transistor Pa and is, for example, 0.4 V. The absolute value of the threshold voltage of n-channel MOS transistor Nb is smaller than the absolute value of the threshold voltage of n-channel MOS transistor Na. In the following description, these MOS transistors having the threshold voltages of smaller absolute values will be referred to as low-Vth MOS transistors.

In each of inverters IVL1–IVL4, standard MOS transistors Pa and Na receive on their gate electrodes the input signal of the inverter at the upstream stage spaced by an odd number of stage(s) of inverter(s), and low-Vth MOS transistors Pb and Nb receive on their gates the output signal of the inverter at the immediately upstream stage. In these inverters IVL1–IVL4, the signals which are applied to the gate electrodes of standard MOS transistors Pa and Na are referred to as forestalling signals. An operation of the delay circuit shown in FIG. 1A will be described below.

It is assumed that this delay circuit is used in a semiconductor device having two operation cycles, i.e., a standby cycle and an active cycle. In the standby cycle, the logical level of the signal applied onto input node 5 is held at H-level or L-level. In this state, one of standard MOS transistors Pa and Na in each of inverters IVL1–IVL4 is turned off by the forestalling signal.

For example, when the signal applied onto input node 5 is at H-level, p-channel standard MOS transistor Pa in inverter IVL1 is off, n-channel standard MOS transistor Na in inverter IVL2 is on and p-channel standard MOS transistor Pa in inverter IVL3 is off. In inverter IVL1, both n-channel MOS transistors Na and Nb are on, and therefore the potential on a node D is at L-level. In inverter IVL4, n-channel standard MOS transistor Na is off. Therefore, a leak current path from power supply node 1 to ground node 2 is interrupted or cut off, and substantially no or only an negligible leak current flows during a standby cycle.

In this standby cycle, the standard MOS transistors are used as current-cut transistors in inverters IVa and IVb, so that substantially no or only an negligible leak current flows in the standby cycle.

Figure 1B:
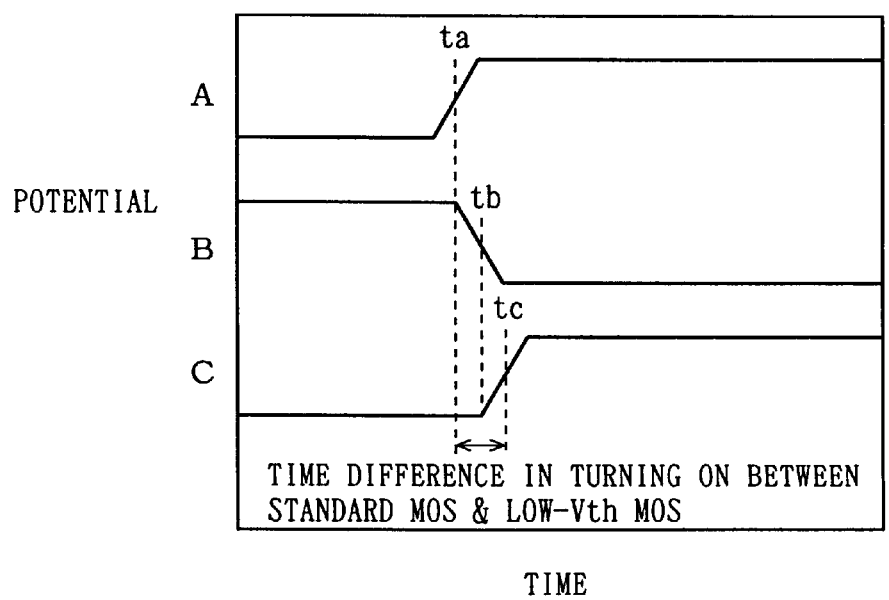
FIG. 1B is a signal waveform diagram representing an operation of the circuit of FIG. 1A.

An operation in the active cycle will be described below with reference to a signal waveform diagram of FIG. 1B.

The potential level of the signal applied onto input node 5 rises, and the potential level of the forestalling signal applied from node 5 onto node A rises. When the potential level on node A (input node 5) exceeds the threshold voltage of standard MOS transistor N1 in inverter IVa, standard MOS transistor N1 is turned on at time ta, and the potential on node B starts to lower.

When the potential level on node B lowers, standard MOS transistor P1 in inverter IVb starts to be turned on to start to raise the potential level on node NC. When the potential level on node C starts to rise at time tb, low-Vth MOS transistor Nb in inverter IVL1 starts to be turned on at time c. At this time, MOS transistor Na is already turned on owing to the forestalling signal on node A (signal potential on node A), and both MOS transistors Nb and Na are already turned on in accordance with rising of the potential on node C, so that node D is rapidly discharged.

Thereafter, in each of inverters IVL2–IVL4, the standard MOS transistor is turned on and then the low-Vth MOS transistor of the same conductivity type is turned on to charge/discharge the corresponding output node. Therefore, the change in potential on the output node of each of inverters IVL1–IVL4 is determined by the current driving capability of the low-Vth MOS transistor (assuming that the low-Vth MOS transistor and the standard MOS transistor have the substantially same current driving capabilities under the condition of the same gate-source voltage).

An on-off operation sequence of the MOS transistors will be described below with reference to FIGS. 2A–2C. FIGS. 2A–2C show a structure of the inverter portion which drives its output node to L-level in accordance with an output signal at H-level. In FIG. 2A, the gate potential of the low-Vth MOS transistor Pb is at H-level in the standby cycle. In this state, the standard MOS transistor Pa is off, so that the current path is cut off.

In FIG. 2B, when the forestalling signal falls from H-level to L-level, the standard MOS transistor Pa is turned on to connect electrically power supply node 1 to the source of low-Vth MOS transistor Pb. In this state, low-Vth MOS transistor Pb is still off.

As shown in FIG. 2C, the potential on the gate electrode of low-Vth MOS transistor Pb starts to change from H-level to L-level, low-Vth MOS transistor Pb is turned on to charge its output node, and the signal on the output node rises from L-level to H-level.

In each of these inverters IVL1–IVL4, therefore, the standard MOS transistor is supplied on its gate with the signal preceding a little in phase the input signal for the low-Vth MOS transistor to be turned on, respectively. Thereby, when the low-Vth MOS transistor is to be turned on, the source of this low-Vth MOS transistor is connected to the power supply (or ground), and charges/discharges the output node in accordance with its gate potential. Accordingly, the charge/discharge currents of the low-Vth MOS transistor has a small dependency on the power supply voltage (i.e., the supply current changes in quantity only to a small extent even when the power supply voltage changes), and it is therefore possible to reduce a dependency of the input/output characteristics of inverters IVL1–IVL4 on the power supply voltage, so that a dependency of the delay time on the power supply voltage can be made small.

FIG. 3 schematically shows changes in output signal in the cases that the H-level of the input signal are 3.3 V and 2.0 V, respectively. When input signal IN exceeds threshold voltage Vthn of n-channel low-Vth MOS transistor, charging of output signal OUT starts. Output signal OUT reaches H-level of 3.3 V or 2.0 V which depends on the power supply voltage level. When the power supply voltage is 2.0 V, the current driving capability of the low-Vth MOS transistor is slightly small, so that the rising speed or rate of the output signal OUT is slightly small. However, if there is substantially no difference between a time Tb at which output signal OUT reaches 3.3 V and a time Ta at which it reaches 2.0 V, both the signals are made definite at the same time, and there is substantially no change in access time or operation speed.

In the course of falling of input signal IN from H-level to L-level, discharging of output signal OUT starts when the level of input signal IN falls by a potential corresponding to the absolute value of threshold voltage Vthp of p-channel low-Vth MOS transistor. In this case, its charging current is likewise small if the power supply voltage is low. However, a transition width of output signal OUT is 2.0 V, and a time required for reaching L-level can be substantially equal to or smaller than that in the case that output signal OUT has an amplitude of 3.3 V. Therefore, a dependency of the operation speed on the power supply voltage is small, and desired characteristics can be maintained even with the low power supply voltage.

Therefore, even in the case that the power supply voltage is low, it is possible, by employing the low-Vth MOS transistor, to reduce significantly the dependency of the falling/rising times of its output signal on the power supply voltage, and correspondingly the dependency of the delay time on the power supply voltage can be made small as shown in FIG. 3. The power supply voltage related to this dependency is the power supply voltage of the rated value, and also is the power supply voltage which varies due to consumption of the current by the operations of internal circuits during a normal operation. When this dependency on the power supply voltage is small, stable operations can be ensured.

FIG. 4 shows relationships between a gate-source voltage Vgs and a drain current Ids in the low-Vth MOS transistors. A curve C1 represents characteristics of a MOS transistor having a threshold voltage of Vth2. A curve C2 represents characteristics of a MOS transistor having a threshold voltage of Vth1. Threshold voltage Vth2 is higher than threshold voltage Vth1. When the power supply voltage lowers from Vb to Va in accordance with curve C1, the drain current varies from Ib1 to Ia1. On curve C2, the drain current varies from Ib2 to Ia2 in accordance with change in power supply voltage from Vb to Va. Rates of these variations satisfy the relationship of Ib1/Ia1>Ib2/Ia2. In the MOS transistor having characteristics of curve C1, the drain current changes rapidly in accordance with the variation in power supply voltage because current Ia1 is small, so that the quantity of current changes at a large rate, and therefore the dependency of the rising/falling times on the power supply voltage is large.

On the other hand, in the MOS transistor having the characteristics represented by curve C2, threshold voltage Vth1 is low, and a relative large current Ia2 flows even at voltage Va. Therefore, this variation rate of Ib2/Ia2 is relatively small, so that the drain current varies only at a small variation rate even when the power supply voltage varies, and therefore the dependency on the power supply voltage can be made small.

Figure 5:
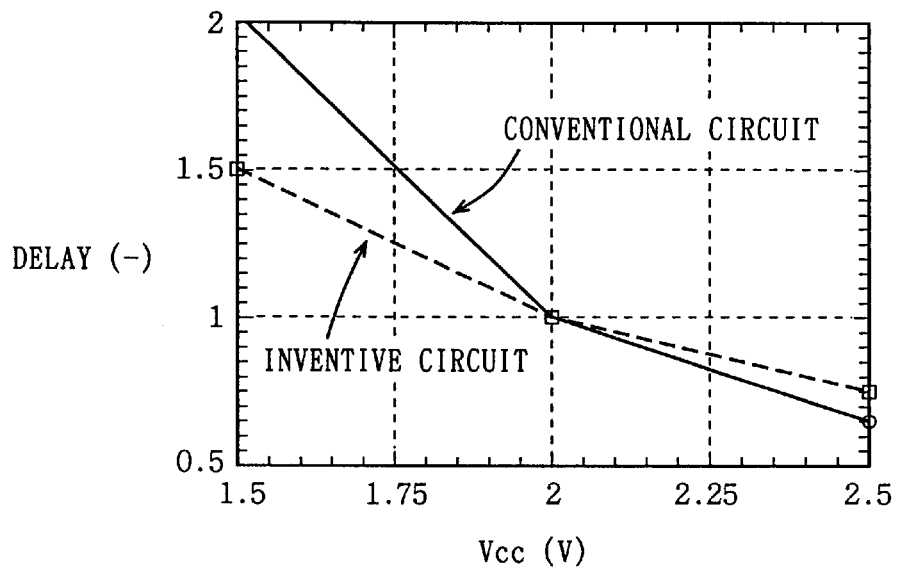
FIG. 5 shows a dependency, on a power supply voltage, of a delay time of a delay circuit as the semiconductor gate circuit according to the invention.

FIG. 5 shows the dependency of the delay time on the power supply voltage in the semiconductor gate circuit according to the invention. FIG. 5 also shows, for comparison, by a solid line a dependency on the power supply voltage in a circuit structure using standard MOS transistors in the prior art. In FIG. 5, the abscissa gives power supply voltage Vcc, and the ordinate gives the delay time. On the ordinate, the delay is represented with the delay time under power supply voltage Vcc of 2.0 V assuming 1.

The gate circuit according to the invention provides a smaller delay time variation than the conventional circuit when power supply voltage Vcc varies. For example, when power supply voltage Vcc is 1.5 V, the delay time is about 1.5 times longer than that under power supply voltage Vcc of 2 V, and the rate is sufficiently smaller than the value of the conventional circuit whose delay time is 2 or more times larger than that with power supply voltage Vcc of 2 V.

When power supply voltage Vcc is 2.5 V, the delay time in the semiconductor gate circuit according to the invention is about 0.75 times longer than that with power supply voltage Vcc of 2 V in contrast to the value of the conventional circuit whose delay time is about 0.65 times larger than that with power supply voltage Vcc of 2 V. The magnitude of variation of the delay circuit in the gate circuit of the invention is smaller than that in the prior art. Therefore, in the structure wherein the low-Vth MOS transistor and the standard MOS transistor are connected in series, the low-Vth MOS transistor is turned on while the standard MOS transistor is on, whereby the delay circuit of the small dependency on the power supply voltage can be achieved.

In the delay circuit shown in FIG. 1, inverters IVa and IVb at the first and second stages are used for forming the forestalling signals. These are CMOS inverters using the standard MOS transistors, and have the dependency on the power supply voltage. However, the delay times of these inverters IVa and IVb are set to be sufficiently smaller than the delay times of inverters IVL1–IVL4, whereby it is possible to neglect the influence which is applied by the delay provided by inverters IVa and IVb on the delay times of this delay circuit.

[Embodiment 2]

Figure 6:
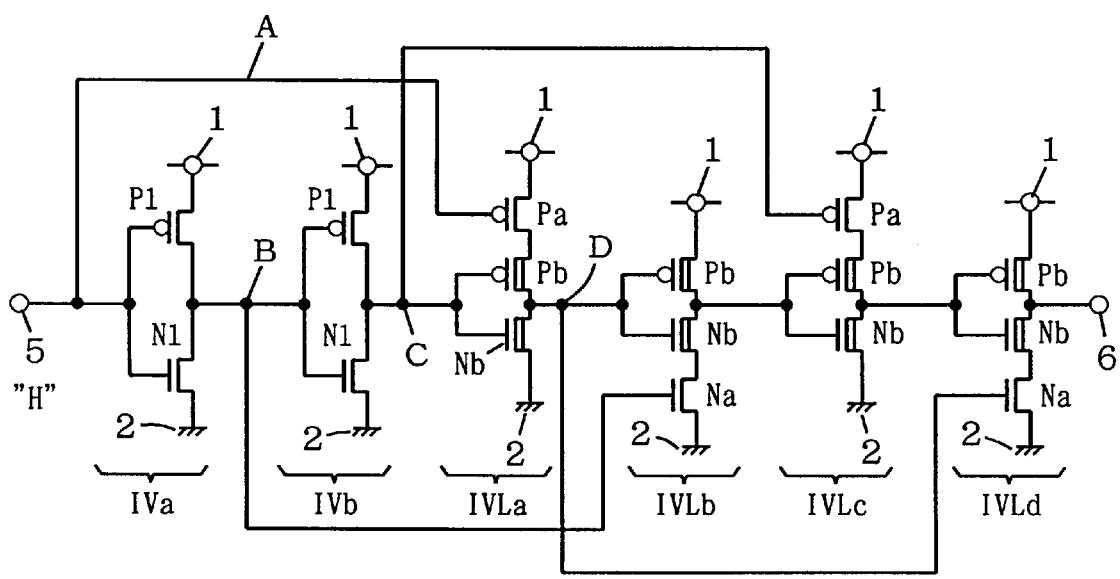
FIG. 6 shows a structure of a delay circuit of an embodiment 2 of the invention.

FIG. 6 shows a structure of a semiconductor gate circuit according to an embodiment 2 of the invention. In FIG. 6, the signal applied onto input node 5 is fixed to H-level during standby. In FIG. 6, the delay circuit according to the embodiment 2 of the invention includes two cascaded inverters IVa and IVb which receive the signal applied onto input node 5, and four cascaded inverters IVLa–IVLd receiving an output signal of inverter IVb. Inverter IVa and IVb have the same structures as those in the delay circuit according to the embodiment 1 shown in FIG. 1 and each are formed of standard MOS transistors P1 and N1.

In inverters IVLa–IVLd, current source cut-off standard MOS transistors are eliminated depending on the logical levels of the input signals during standby. In inverter IVLa, p-channel standard MOS transistor Pa and p-channel low-Vth MOS transistor Pb are connected in series between power supply node 1 and its output node D, and n-channel low-Vth MOS transistor Nb is connected in series between output node D and ground node 2. In inverter IVLb, p-channel low-Vth MOS transistor Pb is connected between power supply node 1 and its output node, and n-channel low-Vth MOS transistor Nb and n-channel standard MOS transistor Na are connected between its output node and ground node 2. Inverter IVLc has the same structure as inverter IVLa. Inverter IVLd has the same structure as inverter IVLb.

In each of inverters IVLa–IVLd, standard MOS transistor Pa or Na receives on its gate electrode the forestalling signal, i.e., the input signal of the inverter at the upstream stage spaced by one stage. Therefore, the form of connection is the same as that of the delay circuit shown in FIG. 1.

During standby, it is the low-Vth MOS transistor in the off state that a leak current flows. In the turned-on low-Vth MOS transistor, its output node is electrically connected to the power supply node or the ground node, and its drain and source attain the same potential, so that a problem of the leak current does not occur. The current source cut-off standard MOS transistor, i.e., standard MOS transistor is connected between the low-Vth MOS transistor which is to be off during standby, and power supply node 1 or ground node 2, and is set to the off state during standby, whereby the leak current path can be cut off, and no or substantially no leak current flows during standby. In FIG. 6, when the signal on input node 5 (node A) is at H-level during standby, p-channel low-Vth MOS transistors Pb are off in inverters IVLa and IVLc. Accordingly, p-channel standard MOS transistors Pa are connected in series to these p-channel MOS transistors Pb in inverters IVLa and IVLc.

Meanwhile, in inverters IVLb and IVLd, it is n-channel low-Vth MOS transistors that receive input signals at L-level and are off during standby. Therefore, current source cut-off n-channel standard MOS transistors Na are connected in series to these MOS transistors Nb. During standby, a path of a leak current is cut off, so that a current consumption during standby can be significantly reduced.

The logical level of the signal applied onto the input node is determined in advance to be H-level as follows. For example, an SRAM (Static Random Access Memory) includes an address transition detecting circuit (ATD circuit) which detects address transition and generates various control signals determining timings of internal operations. The output signal of the address transition detecting circuit is fixed to H-level or L-level (depending on another circuit receiving the output signal thereof) during standby. In a DRAM (Dynamic Random Access Memory), internal circuits are in a precharged state during standby, and each internal node is fixed to a predetermined H-level or L-level. In this DRAM, for example, all output signals of address buffers are set to L-level during standby, and a bit line equalize instructing signal for equalizing bit line pairs is fixed to H-level, so that the bit lines are held at a predetermined voltage level. This bit line equalize instructing signal is produced in accordance with an externally applied row address strobe signal /RAS. Row address strobe signal/RAS is at H-level during standby. Therefore, the circuit portions described above can employ the delay circuit shown in FIG. 6.

According to the embodiment 2 of the invention, as described above, in the circuit structure having the input and output fixed to predetermined logical levels in a standby state, the standard MOS transistors are connected in series to the low-Vlth MOS transistors to be turned off in the standby state. Therefore, transistors forming the delay circuit can be reduced in number, and therefore a layout area, i.e., an area occupied by the circuit can be reduced.

[Embodiment 3]

Figure 7A:
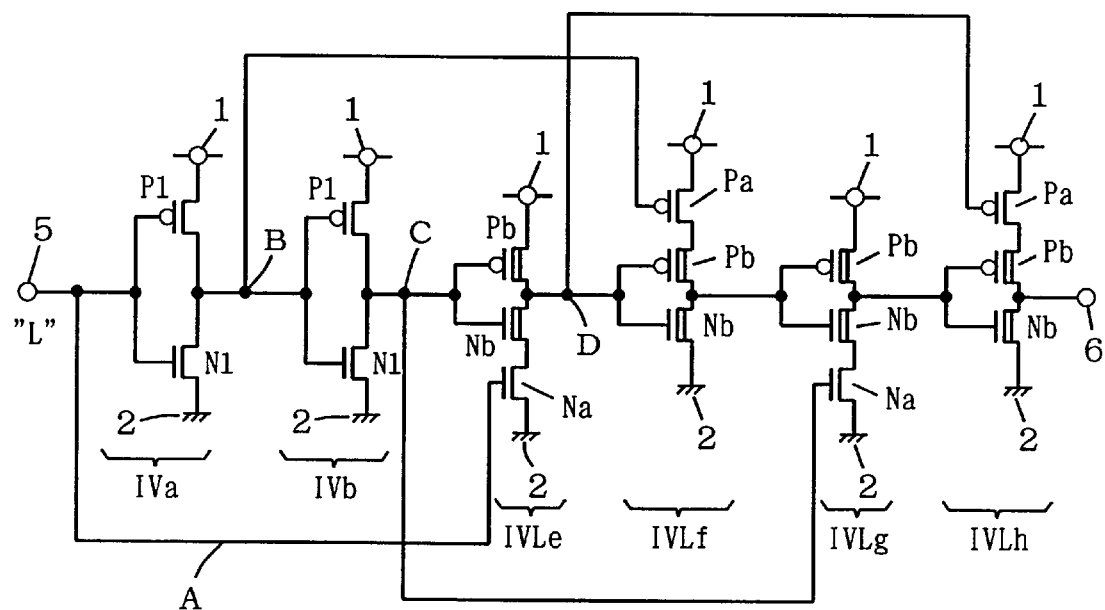
FIG. 7A shows a structure of a delay circuit according to an embodiment 3 of the invention.

FIG. 7A shows a structure of a delay circuit according to an embodiment 3 of the invention. In the delay circuit shown in FIG. 7A, a signal applied onto input node 5 is fixed to L-level during standby. This delay circuit includes two cascaded inverters IVa and IVb receiving the signal applied onto input node 5 as well as four cascaded inverters IVLe–IVLh receiving an output signal of inverter IVb. Inverters IVa and IVb have the same structures as those in the delay circuit of the embodiment 1 shown in FIG. 1, and they each are formed of standard MOS transistors P1 and Ni.

In inverters IVLe–IVLh, standard MOS transistors for cutting off the current source during standby are eliminated depending on the logical levels of the input signals which are applied during standby. More specifically, the p-channel standard MOS transistors for cutting off the source current are eliminated in inverters IVLe and IVLg receiving signals at L-level during standby. The n-channel standard MOS transistors for cutting off the current source are eliminated in inverters IVLf and IVLh receiving signals at H-level during standby. Structures other than the above are the same as those shown in FIG. 1, and the corresponding portions bear the same reference numbers.

In the structure of the delay circuit shown in FIG. 7A, each of inverters IVLe and IVLg are in such a state that the p-channel MOS transistor is on and has charged its output node to H-level during standby. In this charged state, the output node and power supply node 1 are at the same potential level, so that a leak current through p-channel low-Vth MOS transistor Pb does not occur. N-channel standard MOS transistor Na is connected in series to n-channel low-Vth MOS transistors Nb in the off state. Standard MOS transistor Na receives on its gate the signal at L-level and is turned off to cut off the leak current.

In each of inverters IVLf and IVLh in a standby state, n-channel low-Vth MOS transistor Nb is on and has discharged its output node to the ground voltage level. In this state, the source and drain potentials of n-channel low-Vth MOS transistor Nb are at the same level, and no leak current flows. Meanwhile, p-channel standard MOS transistor Pa is connected in series to p-channel low-Vth MOS transistor Pb which is off during standby, and p-channel standard MOS transistor Pa receives on its gate the signal at H-level and is off. Thereby, a leak current is cut off.

In the delay circuit shown in FIG. 7A, the standard MOS transistors are connected in series only to the low-Vth MOS transistors which are kept in the off state by the signals at L-level during standby. Thus, components of the circuit can be reduced in number, and the area occupied thereby can be reduced.

Figure 7B:
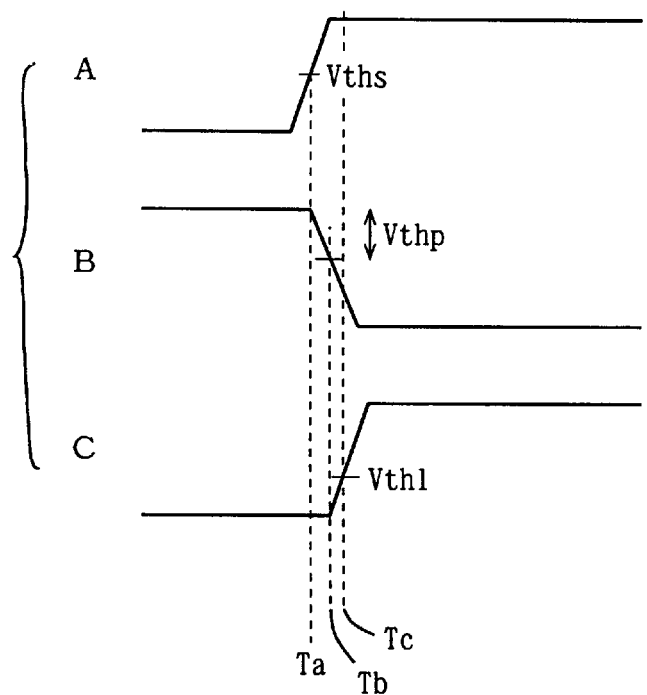
FIG. 7B is a signal waveform diagram representing an operation of the circuit of FIG. 7A.

FIG. 7B shows more specifically a relationship in potential change among nodes A, B and C in the embodiments 1 to 3. In FIG. 7B, the potential on node A rises and exceeds threshold voltage Vths of the standard MOS transistor at time Ta, and n-channel standard MOS transistor Nl in inverter IVb starts to be turned on and discharge the output node thereof. At time Tb, this discharging lowers the potential on node B to a value which is lower by an absolute value of threshold voltage Vthp of p-channel standard MOS transistor P1 than the power supply voltage. Accordingly, standard MOS transistor P1 in inverter IVb starts to be turned on to charge output node C thereof. At time Tc, the potential on node C exceeds threshold voltage Vthn of low-Vth MOS transistor Na, and charging of the output node of the inverter at the next stage starts.

At time Tc when the low-Vth MOS transistor starts to be turned on, the forestalling signal on node A is already at the potential level higher than threshold voltage Vths of the standard MOS transistor, or is already definite at the power supply voltage level. Therefore, when the low-Vth MOS transistor is being turned on, the forestalling signal is surely in the definite state and has set the standard MOS transistor to the on state. Therefore, the states of the low-Vth MOS transistor and the standard MOS transistor do not simultaneously change into the on state, and, at the time of turning on of the low-Vth MOS transistor, the corresponding standard MOS transistor can be surely set to the on state to operate as the current source.

[Embodiment 4]

Figure 8:
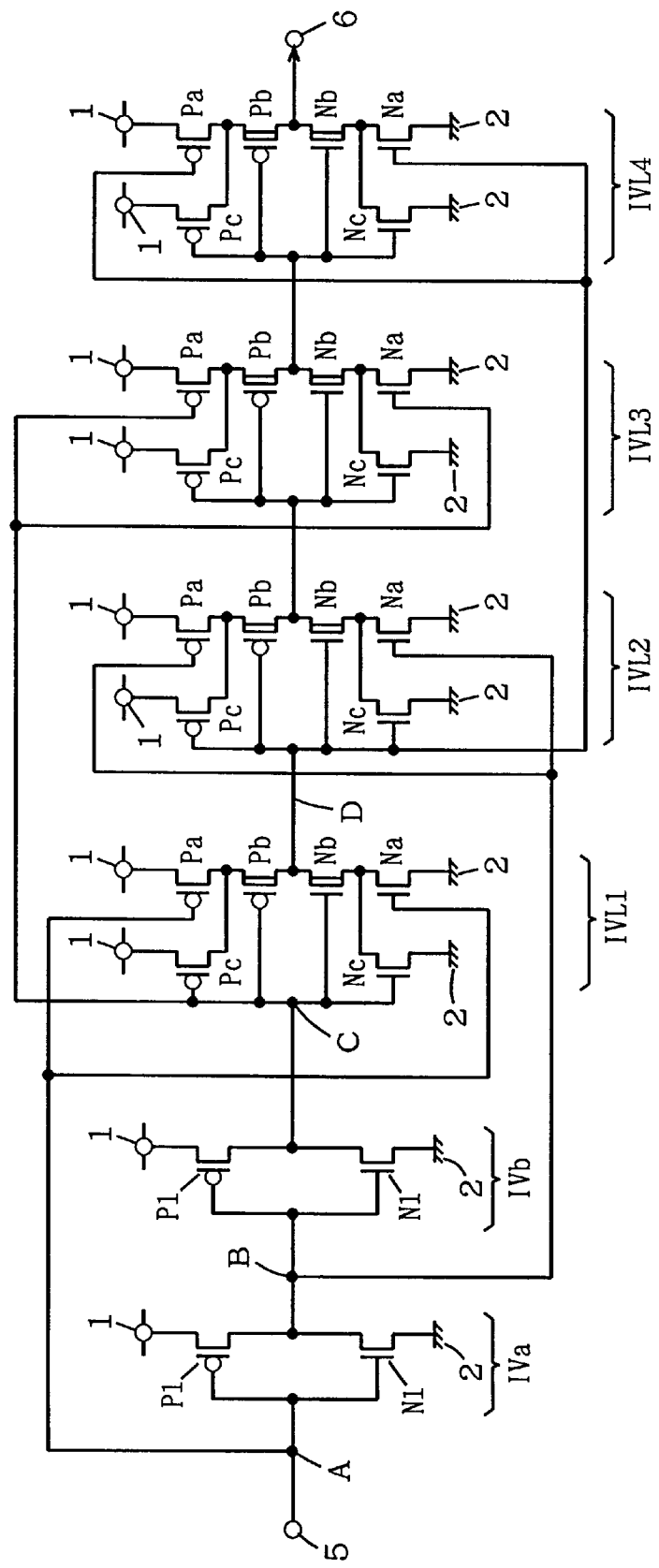
FIG. 8 shows a structure of a delay circuit according to an embodiment 4 of the invention.

FIG. 8 shows a structure of a delay circuit according to an embodiment 4 of the invention. The delay circuit shown in FIG. 8 differs from the delay circuit shown in FIG. 1 in the following point. In each of inverters IVL1–IVL4, a p-channel standard MOS transistor Pc is connected between the connection node connecting p-channel standard MOS transistor Pa with p-channel low-Vth MOS transistor Pb and power supply node 1, and an n-channel standard MOS transistor Nc is connected between the connection node connecting n-channel standard MOS transistor Na with n-channel low-Vth MOS transistor Nb and ground node 2. Structures other than the above are the same as those of the delay circuit shown in FIG. 1. The corresponding portions bear the same reference numbers, and will not be described below in detail.

These additional standard MOS transistors Pc and Nc receive output signals of the inverters at the immediately upstream stages, respectively. An operation of the delay circuit shown in FIG. 8 will be described below with reference to a signal waveform diagram of FIG. 9.

Figure 9:
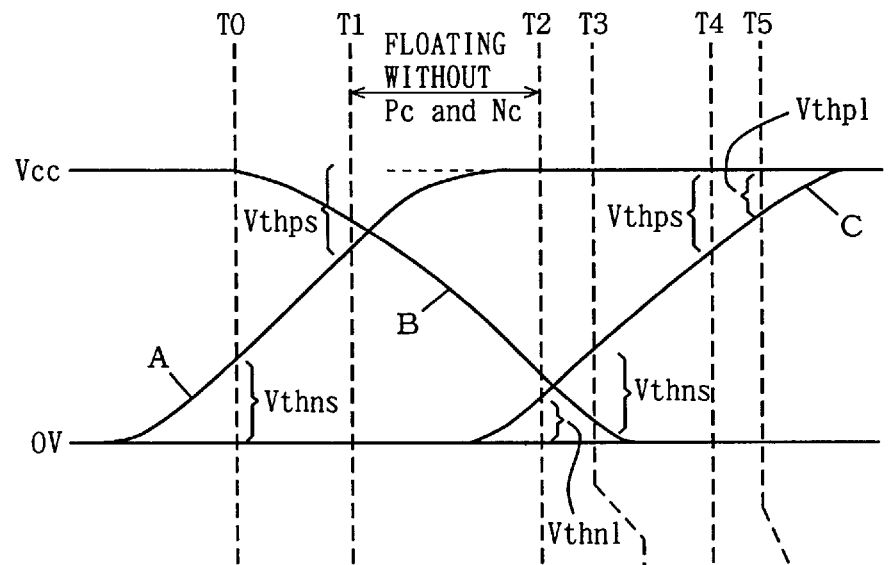
FIG. 9 shows an operation of the delay circuit shown in FIG. 8.

FIG. 9 shows changes in potentials on nodes A, B and C as well as on/off states of the MOS transistors in inverters IVa, IVb and IVL1. In the delay circuit shown in FIG. 8, sets of inverters each including three inverters connected successively perform similar operations. In the following description, therefore, the description will be given on the operations of inverters IVa, IVb and IVL1.

It is now assumed that the signal applied onto node A (input node 5) is at L-level. In this state, node B is at power supply voltage Vcc level of H-level, and node C is at the ground potential (0 V) level of L-level. In inverter IVa, MOS transistor P1 is on, and MOS transistor N1 is off. In inverter IVb, MOS transistor P1 is off, and MOS transistor Nl is on. In inverter IVL1, p-channel standard MOS transistors Pa and Pc as well as p-channel low-Vth MOS transistor Pb are all on, and all MOS transistors Na, Nb and Nc are off.

When the signal potential on node A rises above threshold voltage Vthns of n-channel standard MOS transistor, MOS transistor N1 in inverter IVa is turned on and starts to lower the potential on node B. In this state, MOS transistor P1 in inverter IVa maintains the on state. In accordance with rising of the potential of the forestalling signal on node A, n-channel MOS transistor Na in inverter IVL1 is also turned on. Other MOS transistors still maintain the previous states.

At time T1, the potential on node A reaches the potential level of Vcc+Vthps, and the p-channel standard MOS transistor in inverter IVa changes from the on state to the off state. Here, Vthps represents the threshold voltage of the p-channel standard MOS transistor. In accordance with rising of the signal potential on node A, p-channel standard MOS transistor Pa in inverter IVL1 changes from the on state to the off state. In inverter IVb, in accordance with lowering of the potential on node B, MOS transistor P1 changes from the off state to the on state and also MOS transistor N1 changes from the on state to the off state. In inverter IVL1, both MOS transistors Pb and Pc maintain the on state (node C is not yet charged), MOS transistor Na is on, and MOS transistors Nb and Nc maintain the off state.

In accordance with lowering of the potential on node B, the potential of the output signal of inverter IVb rises. At time T2, the potential on node C reaches threshold voltage Vthn1 of the n-channel low-Vth MOS transistor, and n-channel low-Vth MOS transistor in inverter IVL1 is turned on. Before this time, standard MOS transistor Nc maintains the off state. At time T2, inverter IVb is in such a state that MOS transistor P1 is on and MOS transistor N1 is off.

When the potential on node C exceeds threshold voltage Vthns of the n-channel standard MOS transistor, n-channel standard MOS transistor Nc in inverter IVL1 changes from the off state into the on state. At this time, p-channel standard MOS transistor Pc is still on. Other MOS transistors are in the same states as those at time T2.

At time T3, the potential on node C reaches threshold voltage Vthns of the n-channel standard MOS transistor, and n-channel standard MOS transistor Nc in inverter IVL1 is turned on. In inverter IVL1, p-channel standard MOS transistor Pc is still on and is supplying the current.

At time T4, a difference between the potential on node C and power supply voltage Vcc becomes equal to the absolute value of threshold voltage Vthps of the p-channel standard MOS transistor, and p-channel standard MOS transistor Pc in inverter IVL1 changes from the on state to the off state. In this state, p-channel low-Vth MOS transistor Pb in inverter IVL1 is still on.

At time T5, a difference between the potential on node C and power supply voltage Vcc becomes equal to the absolute value of threshold voltage Vthp1 of the p-channel low-Vth MOS transistor, and p-channel low-Vth MOS transistor Pb in inverter IVL1 is turned off. In accordance with rising of the potential on node C, the output signal of inverter IVL1 reaches the ground voltage level of L-level.

As shown in Eig. 9, output node D of inverter IVL1 is electrically connected to power supply node 1 or ground node 2 (i.e., a current: path is formed) at any time between times T0 and T5. More specifically, for a period between times T0 and T1, all p-channel MOS transistors Pa, Pb and Pc are on so that node D is electrically connected to power supply node 1. From time T1 to time T2, both MOS transistors Pb and Pc are on, and output node D is electrically connected to power supply node 1. Between times T2 and T3, node D is electrically connected to ground node 2 by n-channel MOS transistors Na and Nb, and is also electrically connected to power supply node 1 by p-channel MOS transistors Pb and Pc.

Between times T3 and T4, inverter IVL1 is in such a state that only p-channel standard MOS transistor Pa is off and the other MOS transistors Pb, Pc, Na-Nc are all on. Likewise, node D is electrically connected to power supply voltage 1 and ground node 2. Between times T4 and T5, node D is electrically connected to ground node 2 by n-channel MOS transistors Na, Nb and Nc.

Therefore, in the delay circuit shown in FIG. 8, each of the output nodes of the inverters is electrically connected to at least one of power supply node 1 and ground node 2 regardless of the state of the output node particularly at the time of transition in output signal, so that electrical floating of the output node is prevented. For example, if MOS transistors Pc and Nc are not employed, node D is electrically isolated from both power supply node 1 and ground node 2 for a period from time T1 to time T2.

Figure 10A:
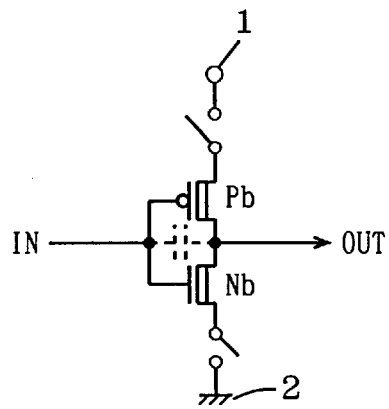
FIGS. 10A and 10B show an operation and an effect of a MOS transistor for fixing an output potential in the delay circuit shown in FIG. 8.
Figure 10B:
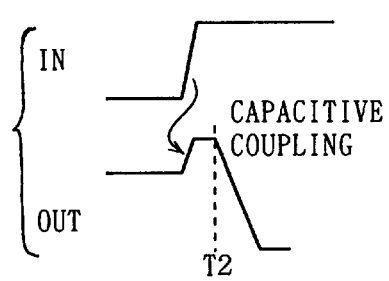

More specifically, low-Vth MOS transistors Pb and Nb are isolated from power supply node 1 and ground node 2 as shown in FIG. 10A. When input signal IN rises from L-level to H-level in the state shown in FIG. 10A, the potential level of output signal OUT temporarily rises, as shown in FIG. 10B, owing to capacitive coupling by capacitances between the gates and drains of MOS transistors Pb and Nb. When the low-Vth MOS transistor is then turned on at time T2, output signal OUT falls to L-level. In FIG. 10A, low-Vth MOS transistor Nb is on, and standard MOS transistor Na is off (this state is shown for the purpose of representing that the current path is cut off). In the structure shown in FIG. 9, low-Vth MOS transistor is off. Meanwhile, standard MOS transistor Na is on. In either case, the output node is electrically floated, and the capacitive coupling occurs.

Due to the above capacitive couplings, noises which may occur at the output signal, may reduce the response speed and may cause malfunction of the circuits. Therefore, provision of additional MOS transistors Pc and Nc can prevent electrical floating of the output nodes, and can prevent the output signal noises which may occur due to the capacitive couplings, so that it is possible to achieve the delay circuit which operates fast and accurately.

FIG. 9 shows such a state that the potential on node A rises from L-level to H-level. When the signal potential on node A falls from H-level to L-level, the operation is performed in a similar manner, in which case the potential on node B can be regarded as the potential on node A, and the potential on node C can be regarded as the potential on node B. Thus, floating of the output node can be prevented.

According to the embodiment 4 of the invention, as described above, the standard MOS transistor, which has the same conductivity type as the low-Vth MOS transistor and receives the same signal as that applied to the gate electrode of this low-Vth MOS transistor, is connected in series between the above low-Vth MOS transistor and the power supply node (or ground node). Therefore, it is possible to prevent: electrical floating of the output node even when the forestalling signal is used, and therefore occurrence of noises at the output signal can be prevented, so that an accurate circuit operation can be ensured.

[Embodiment 5]

Figure 11:
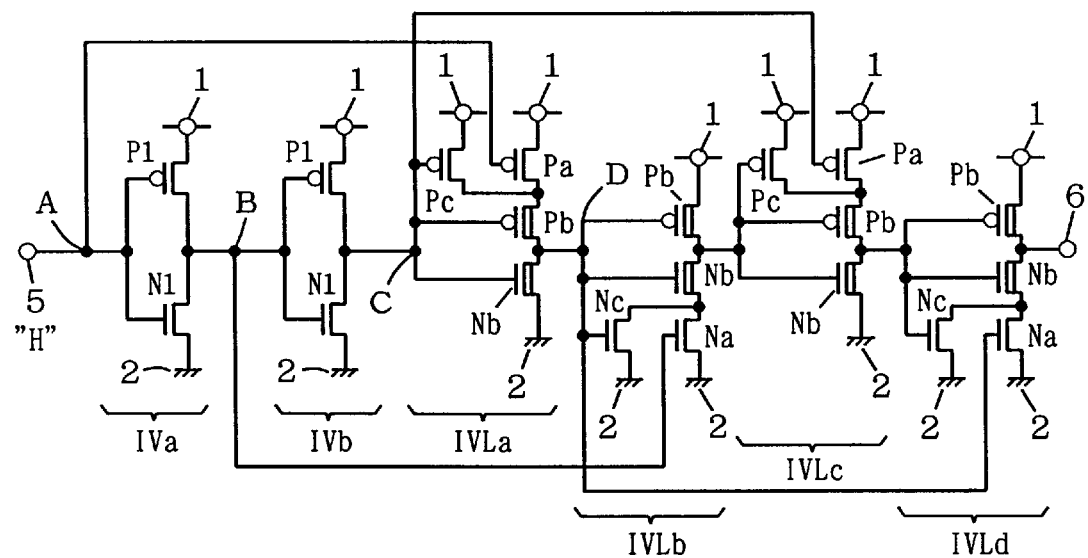
FIG. 11 shows a structure of a delay circuit according to an embodiment 5 of the invention.

FIG. 11 shows a structure of a delay circuit according to an embodiment 5 of the invention. In this delay circuit shown in FIG. 11, the signal applied onto input node 5 is fixed to H-level during standby, and there is a following difference from the delay circuit shown in FIG. 6. Where the standard MOS transistor for cutting off the current source is employed, the standard MOS transistor of the same conductivity type as the standard MOS transistor for cutting off the current source is employed for preventing electrical floating. More specifically, in inverter IVLa, p-channel standard MOS transistor Pc receiving on its gate the signal on node C is arranged between the connection node between MOS transistors Pa and Pb, and power supply node 1.

In inverter IVLb, n-channel standard MOS transistor Nc receiving on its gate the signal on node D is arranged between the connection node between MOS transistors Na and Nb, and ground node 2. In inverter IVLc, p-channel standard MOS transistor Pc having a gate connected to a gate of MOS transistor Pb is arranged between the connection node between MOS transistors Pa and Pb, and power supply node 1. In inverter IVLd, n-channel standard MOS transistor Nc having a gate connected to gates of MOS transistors Nb and Pb is arranged between the connection node between MOS transistors Na and Nb, and ground node 2. Structures other than the above are the same as those shown in FIG. 6. The corresponding portions bear the same reference numbers, and will not be described below in detail.

In the delay circuit shown in FIG. 11, the signal applied onto input node 5 is fixed to H-level during standby. During an operation, the output node of the inverter may be electrically floated when a path formed by the low-Vth MOS transistor and the standard MOS transistor connected in series is cut off. In the structure employing the standard MOS transistor for cutting off the current source, a standard MOS transistor is additionally provided, and the cut-off standard MOS transistor is turned on and off with a delay from turn-on/off of the additional standard MOS transistor, so that it is possible to prevent the output node of the inverter from being electrically floated during operation.

Figure 12:
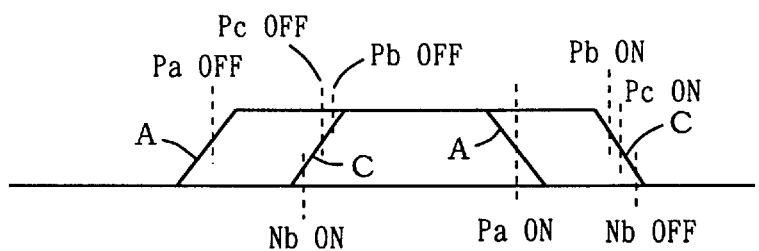
FIG. 12 shows an operation of the delay circuit shown in FIG. 11.

Referring now to FIG. 12, an operation of inverter IVLa will be described below. Other inverters IVLb–IVLd operate in a similar manner. When the potential on node C is at L-level, MOS transistor Pa is turned off by the forestalling signal from node A. In this state, both MOS transistors Pb and Pc are on.

After the potential level on node C starts to rise, low-Vth MOS transistor Nb is first turned on, and then standard MOS transistor Pc is turned off. Thereafter, low-Vth MOS transistor Pb is turned off. Therefore, the output node of inverter IVLa is always connected electrically to the power supply node 1 or ground node 2, and is prevented from electrically floating.

When the potential level on node C falls from H-level to L-level, standard MOS transistor Pa for cutting off the current source is turned on by the forestalling signal from node A. In this state, MOS transistors Pb and Pc are off, but low-Vth MOS transistor Nb is on. When the potential level on node C starts to lower, low-Vth MOS transistor Pb is turned on, and then standard MOS transistor Pc for fixing the potential (for preventing floating) is turned on. Thereafter, low-Vth MOS transistor Nb is turned off. In this state, therefore, the output node of inverter IVLa is always connected electrically to power supply node 1 or ground node 2, and the electrical floating does not occur.

By utilizing the circuit structure shown in FIG. 11, it is possible to reduce the current consumption during standby and reduce the area occupied by the circuit, as can be implemented by the structure shown in FIG. 5, and further it is possible to prevent electrical floating of the output node of the inverter during state transition of the signal and therefore to prevent occurrence of noises at the output signal. Accordingly, the accurate circuit operation can be ensured, and the fast operation is allowed (because noises, if present, would increase the signal amplitude, resulting in delay of timing of defining of the signal).

[Embodiment 6]

Figure 13:
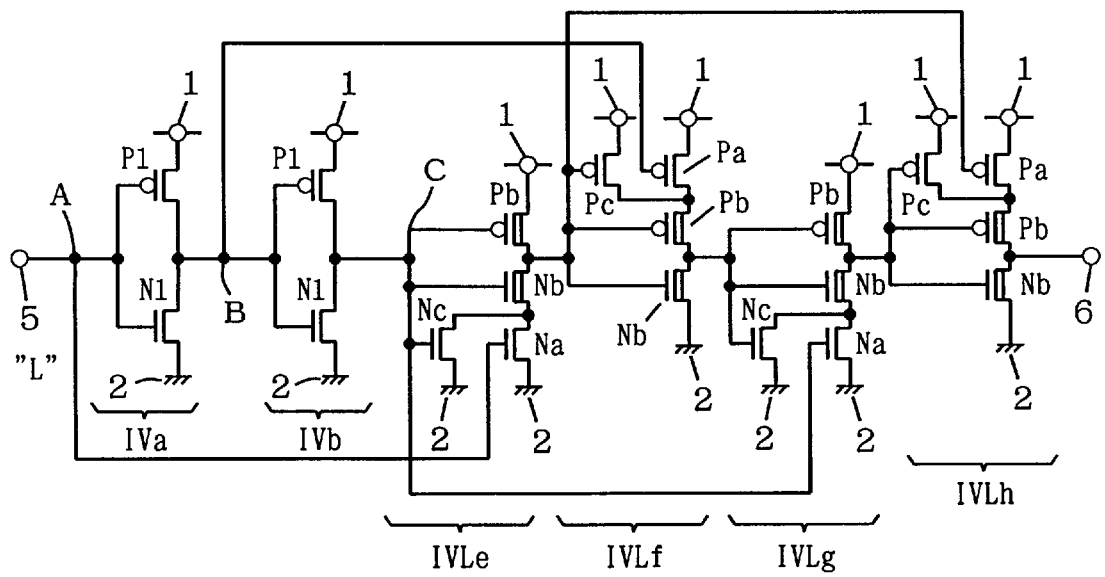
FIG. 13 shows a structure of a delay circuit according to an embodiment 6 of the invention.

FIG. 13 shows a structure of a delay circuit according to an embodiment 6 of the invention. The delay circuit shown in FIG. 13 differs from the delay circuit shown in FIG. 6 in the following point. A standard MOS transistor of the same conductivity type as the MOS transistor for cutting off the current source is arranged in parallel with this current source cut-off MOS transistor.

More specifically, inverter IVLe is provided with n-channel standard MOS transistor Nc, which in turn is connected in parallel with n-channel standard MOS transistor Na and has a gate connected to the gates of corresponding low-Vth MOS transistors Pb and Nb. Inverter IVLf is provided with p-channel standard MOS transistor Pc, which in turn is connected in parallel with current source cut-off p-channel standard MOS transistor Pa and has a gate receiving an output signal of inverter IVLe at the upstream stage. Inverter IVLg is provided with n-channel standard MOS transistor Nc, which in turn is connected in parallel with current source cut-off n-channel standard MOS transistor Na and has a gate receiving an output signal of inverter IVLf at the upstream stage. Inverter IVLh is provided with p-channel standard MOS transistor Pc, which in turn is connected in parallel with current source cut-off p-channel standard MOS transistor Pa and has a gate receiving an output signal of inverter IVLg at the upstream stage.

Similarly to the previous embodiments, the delay circuit shown in FIG. 13 is provided with the potential fixing standard MC)S transistors turning on and off with delays from turning on and off of the standard MOS transistors for cutting off the current source, respectively, so that it is possible to prevent the output node of each inverter from being electrically floated during a transition period of the input signal. Thereby, even in the case that the input signal is fixed to L-level during standby, it is possible to eliminate the leak current completely or to an negligible extent during standby. Also, the circuit components can be reduced in number, and the area occupied by the circuit can be reduced. Further, it is possible to prevent occurrence of noises at the output signal waveform during the transition period of the input signal, so that the delay circuit which can stably perform the fast operation can be provided.

[Embodiment 7]

Figure 14:
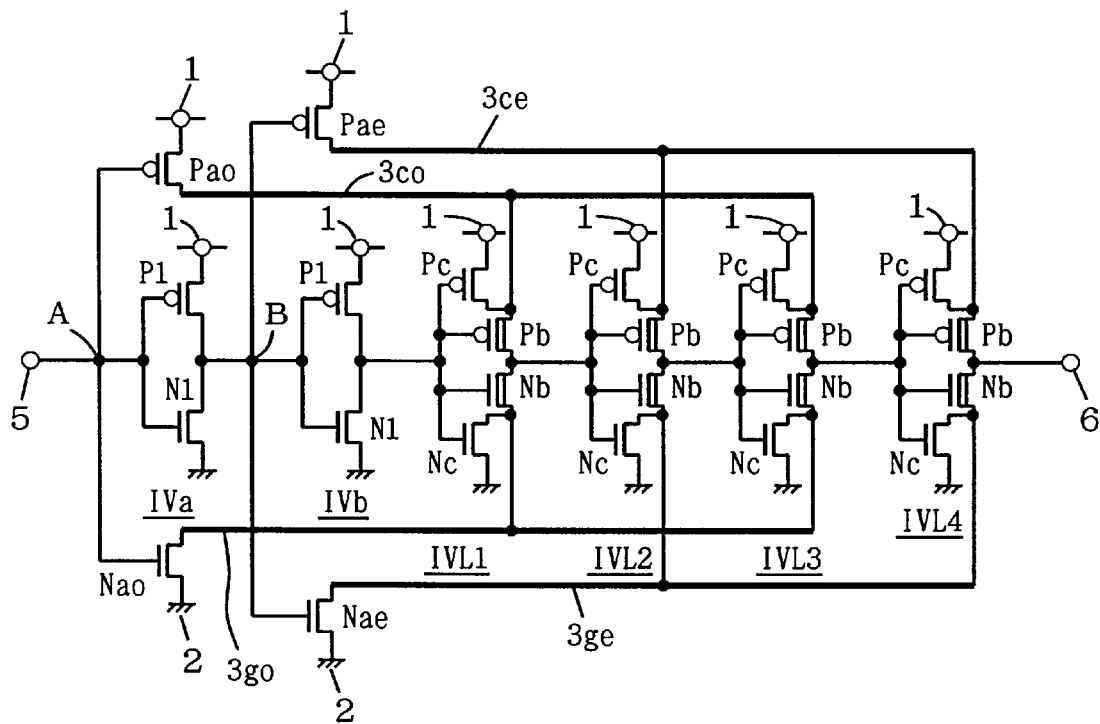
FIG. 14 shows a structure of a delay circuit according to an embodiment 7 of the invention.

FIG. 14 shows a structure of a delay circuit according to an embodiment 7 of the invention. The delay circuit shown in FIG. 14 differs from the delay circuit shown in FIG. 11 in the following point. In delay inverters IVL1 and IVL3 at the odd-numbered stages among delay inverters IVL1–IVL4, low-Vth MOS transistors Pb are connected to a common power supply line $3co$, and low-Vth MOS transistors Nb are commonly connected to a common ground line $3go$. In delay inverters IVL2 and IVL4 at the even-numbered stages, low-Vth MOS transistors Pb are commonly connected to a common power supply line $3ce$, and low-Vth MOS transistors Nb are commonly and electrically connected to a common ground line $3ge$.

A p-channel standard MOS transistor Pa0 receiving on its gate the signal applied onto input node 5 is arranged between common power supply line $3co$ and power supply node 1, and a p-channel standard MOS transistor Pae receiving on its gate the output signal of inverter IVa is arranged between common power supply line $3ce$ and power supply node 1. An n-channel standard MOS transistor Na0 receiving on its gate the signal applied onto input node 5 is arranged between common ground line $3go$ and ground node 2, and an n-channel standard MOS transistor Nae receiving on its gate the output signal of inverter IVa is arranged between common ground line $3ge$ and ground node 2.

In the delay circuit shown in FIG. 14, the standard MOS transistors for cutting off the current source are commonly provided for inverters IVL1 and IVL3 at the odd-numbered stages, and the standard MOS transistors for cutting off the current source is commonly provided for inverters IVL2 and IVL4 at the even-numbered stages. These standard MOS transistors Pa0, Pae, Nao and Nae for cutting off the current source satisfy the conditions that they receive on their gates the signals preceding in phase the input signals of the corresponding inverters, respectively. Therefore, when the low-Vth MOS transistor of the delay inverter changes to the on state, the standard MOS transistor for cutting off the current source has already changed to the on state and operates as the current source. Therefore, an effect similar to that of the delay circuit shown in FIG. 11 can be achieved.

Further, in the delay circuit shown in FIG. 14, the standard MOS transistors for cutting off the current source are arranged in common, so that the number of circuit components and the area occupied by the circuit can be reduced, and the circuit layout can be simplified.

According to the embodiment 7 of the invention, as described above, the standard MOS transistor for cutting off the current source is provided commonly for the delay inverters receiving the input signals of the same phase, so that the circuit layout can be simplified, and the area occupied by the circuit can be reduced.

[Embodiment 8]

Figure 15:
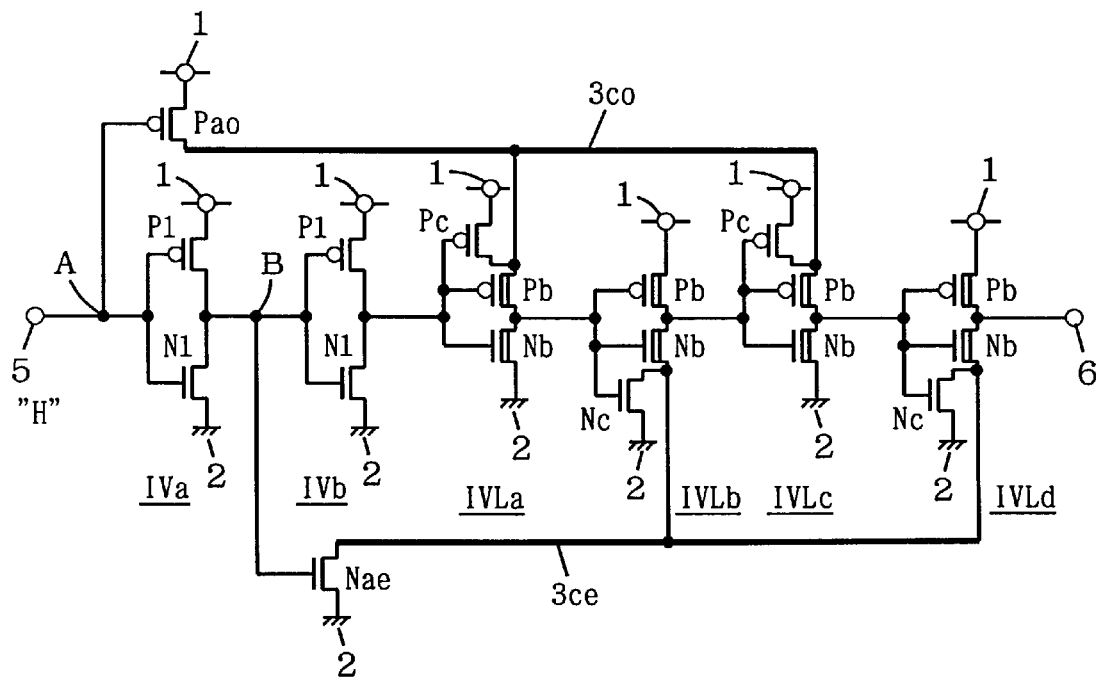
FIG. 15 shows a structure of a delay circuit according to an embodiment 8 of the invention.

FIG. 15 shows a structure of a delay circuit according to an embodiment 8 of the invention. The delay circuit shown in FIG. 15 differs from the delay circuit shown in FIG. 11 in the following point. Low-Vth MOS transistors Pb in inverters IVLa and IVLc at the odd-numbered stages are connected to common power supply line $3co$, and low-Vth MOS transistors Pb in inverters IVLb and IVLd at the even-numbered stages are commonly connected to common ground line $3ce$. P-channel MOS transistor Pao receiving on its gate the signal on node A is arranged between common power supply line $3co$ and power supply node 1. N-channel standard MOS transistor Nae receiving on its gate the signal on node B is arranged between common ground line $3ce$ and ground node 2. Other structures are the same as those shown in FIG. 11.

In the structure shown in FIG. 15, a signal at H-level is applied onto input node 5 during standby. Similarly to the previous embodiment, the delay circuit shown in FIG. 15 has such a structure that the standard MOS transistor for cutting off the current source is provided commonly for the delay inverters IVLa and IVLc at the odd-numbered stages, and the standard MOS transistor for cutting off the current source is provided commonly for the delay inverters IVLb and IVLd at the even-numbered stages. Thereby, the circuit layout is simplified, and the area occupied by the circuit is reduced.

[Embodiment 9]

Figure 16:
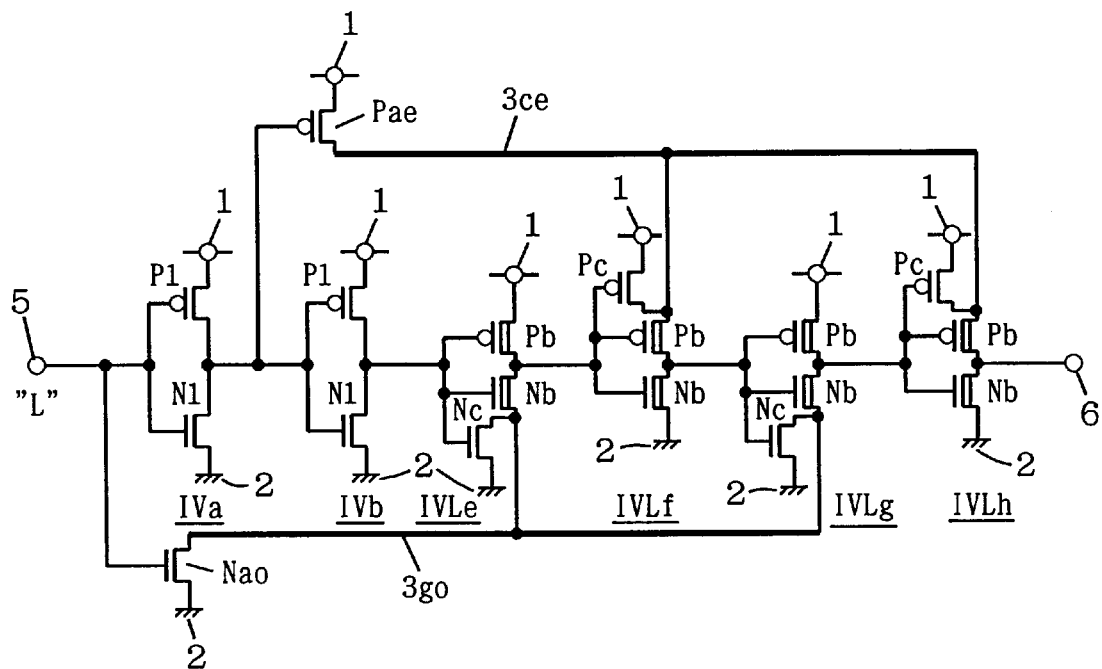
FIG. 16 shows a structure of a delay circuit according to an embodiment 9 of the invention.

FIG. 16 shows a structure of a delay circuit according to an embodiment 9 of the invention. The delay circuit shown in FIG. 16 differs from the delay circuit shown in FIG. 13 in the following point. N-channel low-Vth MOS transistors Nb in delay inverters IVLe and IVLg at the odd-numbered stages are commonly and electrically connected to common ground line $3go$. P-channel low-Vth MOS transistors Pb in delay inverters IVLf and IVLh at the even-numbered stages are commonly and electrically connected to common power supply line $3ce$. Common power supply line $3ce$ is electrically connected to power supply node 1 through p-channel standard MOS transistor Pae receiving on its gate the output signal of inverter IVa. Common ground line $3go$ is electrically connected to ground node 2 through n-channel standard MOS transistor Nao receiving on its gate the signal applied onto input node 5.

In the delay circuit shown in FIG. 16, the signal applied onto input node 5 is fixed to L-level during standby. The delay circuit is provided with the standard MOS transistor for cutting off the current source commonly for delay inverters IVLe and IVLg at the odd-numbered stages, and is provided with the standard MOS transistor for cutting off the current source commonly for the inverters at the even-numbered stages. Therefore, the circuit components can be reduced in number, the circuit layout can be simple, and the area occupied by the circuit can be reduced. Further, an effect similar to that by the structure shown in FIG. 13 can be achieved.

In the structures of the delay circuits shown in FIGS. 14 to 16, the current source cut-off standard MOS transistor provided commonly for the inverters is not required to have a large current driving capability. Since the delay inverters successively change their output signals, low current consumption characteristics which is the distinctive feature of the CMOS inverter is exhibited when one of the inverters changes the state of its output signal, so that this inverter does not substantially consume the current. Since the cascaded delay inverters successively operate, operation currents of these delay inverters are dispersed. Therefore, current source cut-off standard MOS transistors Pae, Pao, Nao and Nae are not required to have large current driving capabilities.

When the delay circuit receives a pulse signal having a width shorter than a sum of rising and falling times tr and tf of the output signal of one delay inverter, the delay inverters successively operate in accordance with this pulse signal. In this case, the output signal of the delay inverter at a certain stage will return to the initial state before it changes completely. Therefore, such a short pulse signal disappears while it is transferred through the delay stages. This provides an upper limit of the operation frequency of the delay circuit, and short spike-like noises disappear within the delay circuit and are not output.

According to the delay circuits of the embodiments 1 to 9 of the invention, as described above, the current source cut-off standard MOS transistor is turned on by the signal preceding in phase the input signal of the delay inverter, and thereafter the low-Vth MOS transistor is driven to be turned on, so that the output node is driven by the low-Vth MOS transistor of which current supply amount has a small dependency on power supply voltage Vcc, so that it is possible to implement the delay circuit which has a small dependency on the power supply voltage and can operate fast even with the low power supply voltage.

[Embodiment 10]

Figure 17:
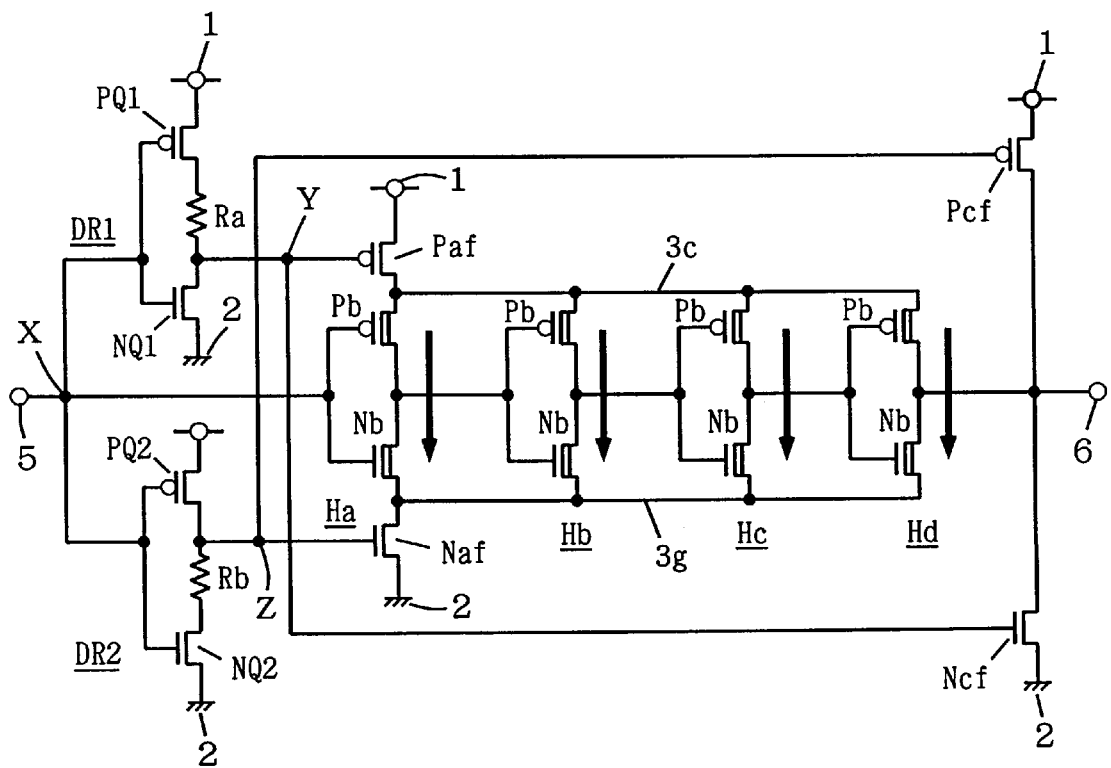
FIG. 17 shows a structure of a delay circuit according to an embodiment 10 of the invention.

FIG. 17 shows a structure of a delay circuit according to an embodiment 10 of the invention. The delay circuit shown in FIG. 17 includes four cascaded inverter circuits Ha, Hb, Hc and Hd which delay the signal applied onto input node 5. The output signal of this delay circuit is applied to output node 6. Each of inverters Ha-Hd includes low-Vth MOS transistors Pb and Nb which are connected in series between a first node 3c and a second node 3g. First node 3c is electrically connected to power supply node 1 through a p-channel standard MOS transistor Paf, and second node 3g is electrically connected to ground node 2 through an n-channel standard MOS transistor Naf.

MOS transistor Paf receives on its gate an output signal of a drive circuit DR1 receiving the signal applied onto input node 5. N-channel standard MOS transistor Naf receives on its gate an output signal of a drive circuit DR2 receiving the signal applied onto input node 5.

Drive circuit DR1 includes standard MOS transistors PQ1 and NQ1 as well as a resistance element Ra for slowing rising of the output signal thereof, and operates as an inverter circuit. Drive circuit DR2 includes standard MOS transistors PQ2 and NQ2 as well as a resistance element Rb for slowing falling of its output signal, and operates an inverter circuit.

More specifically, drive circuit DR1 includes p-channel standard MOS transistor PQ1 and resistance element Ra connected in series between power supply node 1 and a node Y as well as n-channel standard MOS transistor NQ1 connected between node Y and ground node 2 and having a gate connected to input node 5. Drive circuit DR2 includes a p-channel MOS transistor PQ2 connected between power supply node 1 and a node Z and having a gate connected to input node 5 as well as n-channel standard MOS transistor NQ2 and resistance element Rb connected in series between node Z and ground node 2. A gate of MOS transistor NQ2 is connected to input node 5.

The delay circuit further includes a p-channel MOS transistor Pcf connected between power supply node 1 and output node 6 and receiving on its gate the output signal of drive circuit DR2, and an n-channel standard MOS transistor Ncf connected between output node 6 and ground node 2 and receiving on its gate the output signal of drive circuit DR1.

In the delay circuit shown in FIG. 17, standard MOS transistors Paf and Naf operate as the current source cut-off MOS transistors, and standard MOS transistors Pcf and Ncf operate as the output potential fixing MOS transistors. Drive circuits DR1 and DR2 delay the change of current source cut-off MOS transistors Paf and Naf to the off state, and accelerates change to the on state. An operation of the delay circuit shown in FIG. 17 will be described below with reference to a signal waveform diagram of FIG. 18.

When the signal applied onto node X is at L-level, the drive circuit DR1 is in such a state that standard MOS transistor PQ1 is on and node Y is at H-level. Likewise, in drive circuit DR2, standard MOS transistor PQ2 is on, and node Z is at H-level. In this state, standard MOS transistor Paf is off, and standard MOS transistor Naf on, so that common ground line 3g is held at the ground voltage level. Since the signal applied onto input node 5 is at L-level, the potential on output node 6 is at L-level. In this state, current source cut-off MOS transistor Paf is off, and no path for a leak current is present. Meanwhile, standard MOS transistor Pcf is off, and standard MOS transistor Ncf is on so that the output node 6 is fixed to L-level.

When the input signal from input node 5 rises from L-level to H-level and the potential on input node X rises to H-level, the output signals of drive circuits DR1 and DR2 start to change at time t0 after elapsing of delay times of drive circuits DR1 and DR2, respectively, so that the potentials on nodes Y and Z lower to L-level. In drive circuit DR1, standard MOS transistor NQ1 is turned on to discharge rapidly node Y to the ground voltage level and drives rapidly current source cut-off standard MOS transistor Paf to the on state to supply a current to common power supply line 3c. In drive circuit DR2, standard MOS transistor NQ2 is turned on, but node Z is discharged to ground node 2 through resistance element Rb. Therefore, the rising speed thereof is slow, and standard MOS transistor Naf slowly changes to the off state.

At time t1, the potential on node Z lowers below the threshold voltage of standard MOS transistor Naf, and standard MOS transistor Naf is turned off, and common ground line 3g and ground node 2 are electrically isolated from each other. In response to rising of the signal applied onto input node 5 from L-level to H-level, the low-Vth MOS transistors Pb and Nb rapidly change to on/off states, and inverters Ha, Hb, tic and Hd operate. In inverter Ha, low-Vth MOS transistor Nb is turned on, and low-Vth MOS transistor Pb is turned off. In this state, standard MOS transistor Naf is on, and drives its output signal to L-level. Inverter Hb at the next stage rapidly drives its output signal to H-level in accordance with the current applied to common power supply line 3c. Likewise, other inverters Hc and Hd invert and output the signals applied thereto, respectively.

In this operation, if a time period from time t0 to time t1 is longer than the delay time of the delay circuit, inverters Ha–Hd operate owing to formation of a current path between power supply node 1 and ground node 2, and more specifically operate as the delay circuit. When the signal on output node 6 is to be driven to H-level, potential fixing standard MOS transistor Ncf rapidly changes to the off state in accordance with the signal on node Y, and standard MOS transistor Pcf slowly changes to the on state and supplies a current.

Meanwhile, when this input signal lowers from H-level to L-level, potential levels on nodes Y and Z rise owing to drive circuits DR1 and DR2. Node Y is charged through MOS transistor PQ1 and resistance element Ra of drive circuit DR1, and its potential slowly rises. Therefore, standard MOS transistor Paf maintains the on state to supply a current to common power supply line 3c until time t3, i.e., the potential on node Y reaches the voltage level which is lower by the absolute value of threshold voltage of standard MOS transistor Paf than power supply voltage Vcc. Since node Z is charged by MOS transistor PQ2 of drive circuit DR2, the potential on node Z rises rapidly to H-level, and standard MOS transistor Naf rapidly changes to the on state and thereby drives common ground line 3g to the ground voltage level. If the time period from time t2 to time t3 is longer than the delay time of the delay circuit, the delay circuit executes the predetermined operation.

In the delay circuit shown in FIG. 17, particularly in the case where the signal applied onto input node 5 (node X) during standby is fixed to L-level, current source cut-off standard MOS transistor Paf or Naf is held in the off state by drive circuit DR1 or DR2, so that the current path from power supply node 1 to ground node 2 is cut off. The leak current during standby can be surely eliminated or kept at a substantially negligible level even if one low-Vth MOS transistor is on.

The delay circuit is provided with standard MOS transistors Pcf and Ncf which are complementarily turned on for preventing electrical floating of final output node 6 during standby. This is done for preventing the output signal of the inverter at any intermediate stage from attaining the intermediate voltage level due to interruption of the current source, thereby preventing the instable potential level on output node 6.

Figure 19:
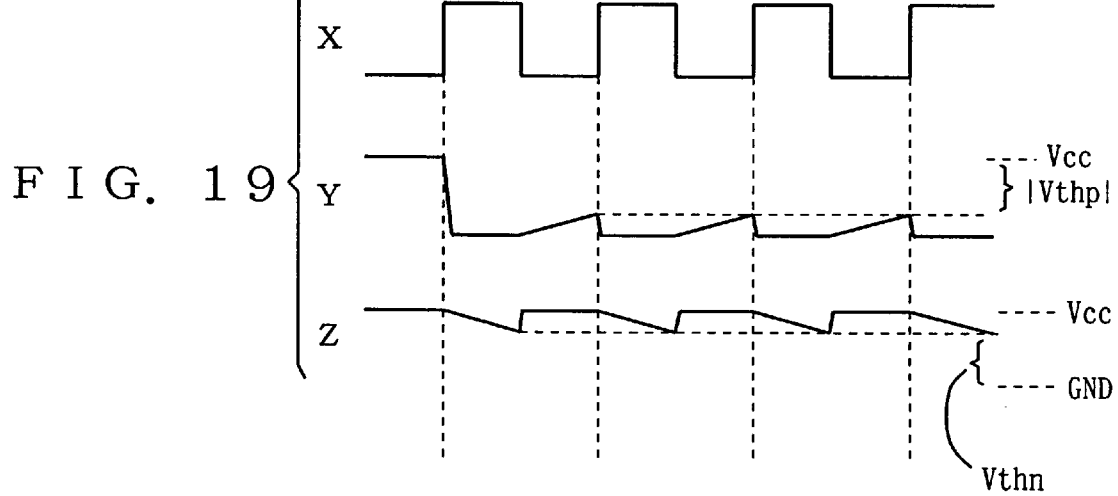
FIG. 19 shows changes in potential on internal nodes during an operation of the delay circuit shown in FIG. 17.

In operation, the signal applied onto input node 5 rapidly changes. As shown in FIG. 19, if the signal applied onto input node 5 rapidly changes, and the cycle of change thereof is sufficiently shorter than the time required for rising of the output signal of drive circuit DR1, the potential level on node Y is determined to be L-level for standard MOS transistor Paf so that standard MOS transistor Paf is always on and supplies a current from power supply node 1 to common power supply line 3c. Likewise, if the cycle of change of this input signal is sufficiently shorter than the rising time required for the output signal of drive circuit DR2, the potential on node Z is determined to be at H-level for standard MOS transistor Naf, and the current path is formed between common ground line 3g and ground node 2. This critical level for node Y is equal to the voltage level of (Vcc−|Vthp|), and the critical level for node Z is equal to Vthn. If the input signal changes its state before reaching this voltage level, the voltage levels on nodes Y and Z rapidly change so that corresponding standard MOS transistors Paf and Naf can be driven to the on state.

Therefore, in accordance with a specific use of this delay circuit, the sizes of standard MOS transistors PQ1, PQ2, NQ1 and NQ2 in drive circuits DR1 and DR2 as well as the resistance values of resistance elements Ra and Rb are set to appropriate values so that current source cut-off MOS transistors Paf and Naf are turned off to cut off the leak current path during standby, and, during operation, current source cut-off standard MOS transistors Paf and Naf are always kept on to supply a current for performing the operation through such an operation that the state of the input signal changes before the output signals of the drive circuits DR1 and DR2 change to drive the corresponding current source cut-off standard MOS transistor to the off state in accordance with the input signal. This input signal (signal on node X) may be any signal provided that its logical level changes before expiration of the period from time t0 to time t1 shown in FIG. 18 and the period from time t2 to time t3.

According to the structure shown in FIG. 17, the delay inverter is formed of low-Vth MOS transistors, and the states of the current source cut-off MOS transistors are rapidly changed to the on state, and are slowly changed to the off state. Therefore, the leak current path can be cut off during standby, and the leak current during standby can be reduced. During operation, the state of the input signal changes before the current source cut-off MOS transistors change to the off state, and these current source cut-off MOS transistors maintain the on state and execute the function as the delay circuit.

[Embodiment 11]

Figure 20:
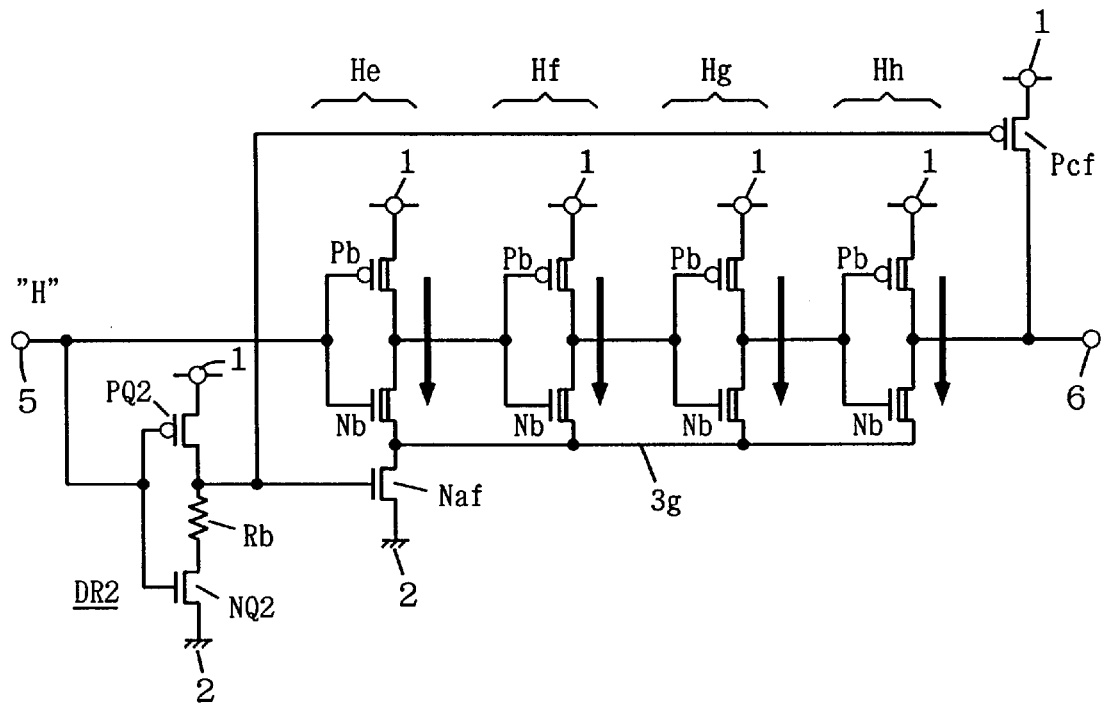
FIG. 20 shows a structure of a delay circuit according to an embodiment 11 of the invention.

FIG. 20 shows a structure of a delay circuit according to an embodiment 11 of the invention. In FIG. 20, this delay circuit includes four cascaded inverters He, Hf, Hg and Hh. The delay circuit shown in FIG. 20 differs from the delay circuit shown in FIG. 17 in the following point.

In delay circuits He–Hh, low-Vth MOS transistors Pb have sources directly and electrically connected to power supply node 1. The sources of low-Vth MOS transistors Nb are commonly and electrically connected to common ground line 3g. Common ground line 3g is connected to ground node 2 through an n-channel standard MOS transistor Naf receiving on its gate the output signal of drive circuit DR2. Output node 6 is electrically connected to power supply node 1 through p-channel standard MOS transistor Pcf receiving on its gate the output signal of drive circuit DR2.

Therefore, the delay circuit shown in FIG. 20 has the same structure as the delay circuit shown in FIG. 17 except for that drive circuit DR1, current source cut-off p-channel standard MOS transistor Paf and output potential fixing n-channel MOS transistor Ncf are eliminated therefrom. During standby, the signal applied onto input node 5 is fixed to H-level.

In this state, the output signal of drive circuit DR2 is at the ground voltage level, i.e., L-level so that n-channel standard MOS transistor Naf is off and cuts off the current path between the common ground line 3g and the ground node 2. In inverters He–Hh, standard MOS transistors Naf cut off the leak current which may flow in the direction indicated by arrows through low-Vth MOS transistors Pb in the off state. The output signal of drive circuit DR2 is at L-level and standard MOS transistor Pcf is on, so that the output node 6 is fixed to H-level.

Therefore, when the signal at H-level is continuously applied during standby as shown in FIG. 20, the leak current during standby can be cut off by cutting off the current path between the common ground line and the ground node. When the signal applied onto input node 5 changes from H-level to L-level in the normal operation cycle, the output signal of drive circuit DR2 rapidly rises to H-level, so that the common ground line 3g is rapidly and electrically connected to ground node 2. When the signal applied onto input node 5 rises from L-level to H-level, the output signal of drive circuit DR2 slowly falls. In this operation, p-channel low-Vth MOS transistor Pb is rapidly turned on, and a signal at H-level is applied onto output node 6 upon elapsing of a predetermined delay time. Therefore, if the input signal changes while standard MOS transistor Naf is on, the operation can be performed by reliably setting the output signals of inverters He-Hh to H-level or L-level.

According to the structure of the embodiment 11 of the invention, as described above, when the logical level of the input signal is fixed to H-level during standby, the current path between the ground node and the common ground node is cut off. Therefore, the circuit components can be small in number, and the circuit layout can be simple. Further, it is possible to prevent the flow of leak current during standby.

[Embodiment 12]

Figure 21:
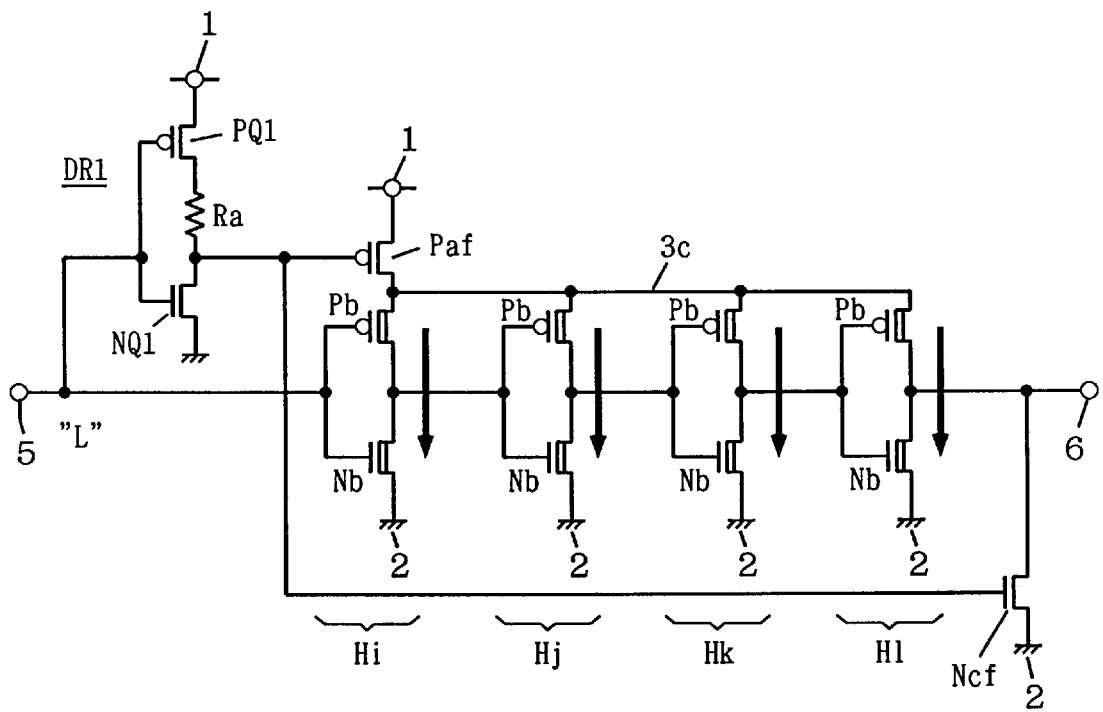
FIG. 21 shows a structure of a delay circuit according to an embodiment 12 of the invention.

FIG. 21 shows a structure of a delay circuit according to an embodiment 12 of the invention. In FIG. 21, the delay circuit includes four cascaded inverters Hi, Hj, Hk and Hl. The delay circuit shown in FIG. 21 has a structure equivalent to that of the delay circuit shown in FIG. 17 except for that drive circuit DR2, current source cut-off n-channel standard MOS transistor Naf and output potential fixing p-channel standard MOS transistor Pcf are eliminated.

In the delay circuit shown in FIG. 21, the signal applied onto input node 5 is fixed to L-level during standby. The output signal of drive circuit DR1 is at H-level in this state, and standard MOS transistor Paf is off and therefore electrically isolates the power supply node 1 from common power supply line 3c. This cuts off the path through which the leak current of inverters Hi-Hl may flow. As a result of this interruption of the current path, the logical level of the output signal of inverter Hi attains an intermediate potential level, i.e., an instable potential level, and output node 6 is electrically floated. In this state, therefore, standard MOS transistor Ncf is turned on in accordance with the output signal of drive circuit DR1, and the potential level of output node 6 is fixed to L-level. Also, electrical floating of the output node 6 is prevented, and an instable state of the output signal during standby is prevented.

In the normal operation cycle, the output signal of drive circuit DR1 falls rapidly and rises slowly, and current source cut-off MOS transistor Paf changes rapidly to the on state and slowly to the off state. Therefore, owing to the fact that the input signal changes during the on state of standard MOS transistor Paf, this delay circuit accurately operates in accordance with the applied input signal.

In the delay circuit shown in FIG. 21, the circuit components can be reduced in number, and the area occupied by the circuit can be reduce similarly to the previous embodiments. It is also possible to reduce the leak current during standby to a negligible order.

[Embodiment 13]

Figure 22:
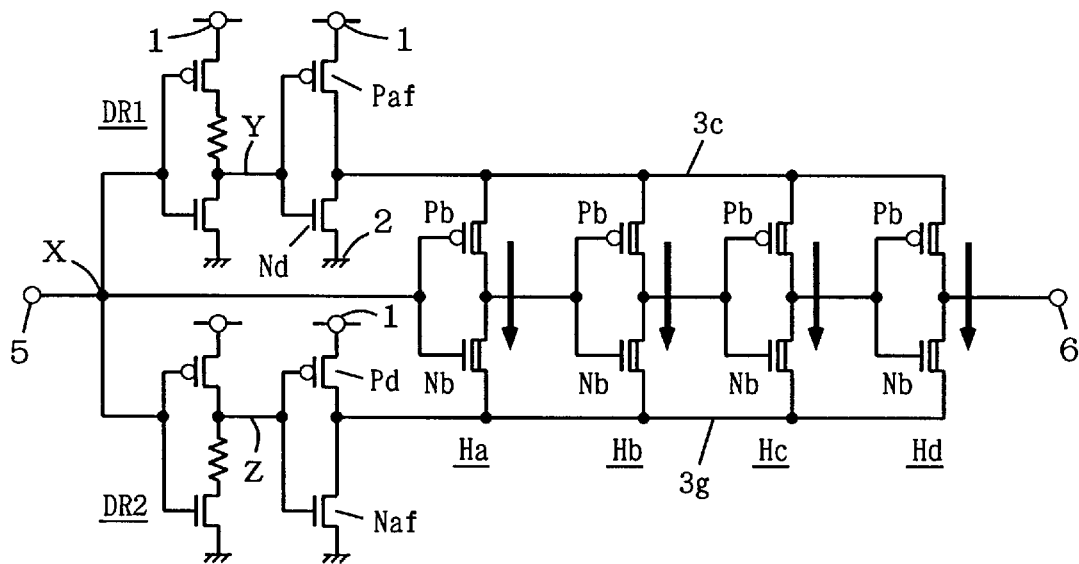
FIG. 22 shows a structure of a delay circuit according to an embodiment 13 of the invention.
Figure 23:
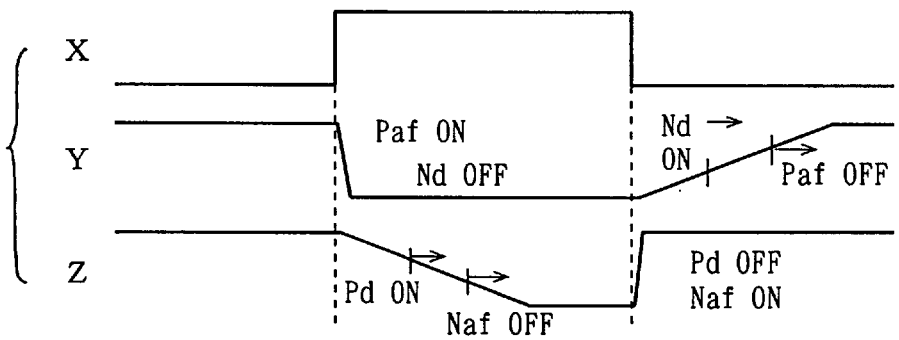
FIG. 23 is a signal waveform diagram showing an operation of the delay circuit shown in FIG. 22.

FIG. 22 shows a structure of a delay circuit according to an embodiment 13 of the invention. The delay circuit shown in FIG. 22 differs from the delay circuit shown in FIG. 17 in the following point. An n-channel standard MOS transistor Nd which is turned on in accordance with the output signal of drive circuit DR1 is arranged between common power supply line 3c and ground node 2. Also, a p-channel standard MOS transistor Pd which is turned on in accordance with the output signal of drive circuit DR2 is arranged between common ground line 3g and power supply node 1. Further, the circuit in FIG. 22 is not provided with standard MOS transistors Pcf and Nef for fixing the potential on output node 6. An operation of the delay circuit shown in FIG. 22 will be described below with reference to a signal waveform diagram of FIG. 23.

When the input signal applied onto a node X rises from L-level to H-level, the output signal of drive circuit DR1 rapidly falls to L-level so that MOS transistor Paf is turned on and MOS transistor Nd is turned off, and common power supply line 3c is connected to power supply node 1 through standard MOS transistor Paf. Meanwhile, the output signal of drive circuit DR2 slowly falls from H-level so that p-channel MOS transistor Pd is first turned on, and thereafter MOS transistor Naf is turned off. Therefore, if the signal applied onto node X is at H-level for a long period, common power supply line 3c and common ground line 3g are both electrically connected to power supply node 1, and the voltage level thereon are brought to H-level. Therefore, the potential on final output node 6 is fixed to H-level, and the output node of each of inverters Ha-Hd is fixed to H-level.

When the input signal falls from H-level to L-level, the output signal of drive circuit DR2 rapidly rises to H-level. Respectively, MOS transistor Pd is turned off and MOS transistor Naf is turned on, so that common ground line 3g is electrically connected to ground node 2. The output signal of drive circuit DR1 slowly rises from L-level to H-level. When the potential level on node Y exceeds the threshold voltage of MOS transistor Nd, this MOS transistor Nd is turned on. When the potential level on node Y further rises and the gate-source voltage of MOS transistor Paf becomes substantially equal to the threshold voltage thereof, this MOS transistor Paf is turned off. Therefore, when the signal on node X is held at L-level for a long time, common power supply line 3c is electrically connected to ground node 2 through MOS transistor Nd, and common ground line 3g is also connected electrically to ground node 2 through MOS transistor Naf, so that the potential level on output node 6 is fixed to L-level, and the output node of each of inverters Ha-Hd is fixed to L-level.

In the normal operation, the input signal changes at the cycle within which current source cut-off MOS transistors Paf and Naf maintain the on state, and common power supply line 2c is electrically connected to power supply node 1. Common ground line 3g is electrically connected to ground node 2.

By using the delay circuit shown in FIG. 22, therefore, common power supply line 3c and common ground line 3g can be set to the logical levels corresponding to the logical level of the input signal in accordance with the input signal, so that the potential level on each internal node (i.e., output node of each inverter) in the delay circuit and the potential level on the final output node can be fixed to prevent electrical floating. Accordingly, upon shifting from the standby state to the active state, the circuit operation does not start at the intermediate potential level but at the stable operation potential level, so that the accurate operation can be ensured, and the operation can start at a fast timing.

[Embodiment 14]

Figure 24:
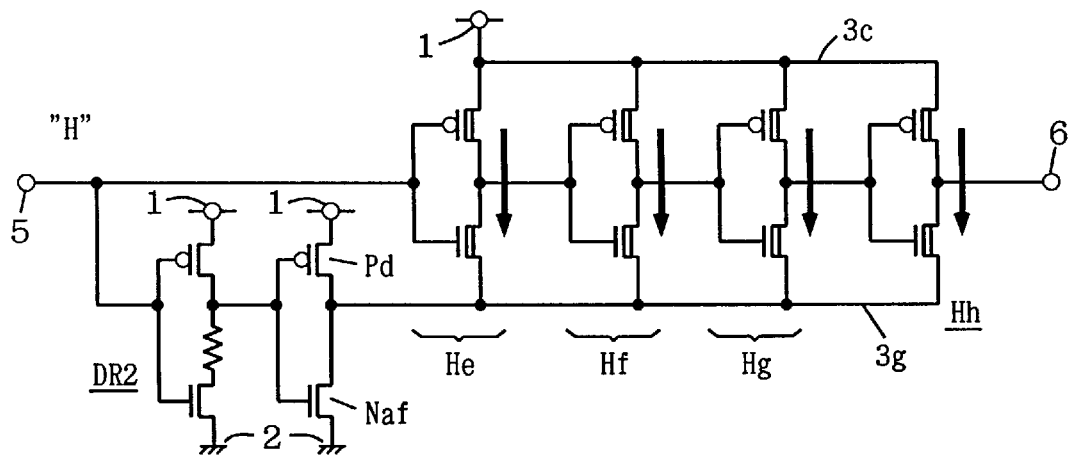
FIG. 24 shows a structure of a delay circuit according to an embodiment 14 of the invention.

FIG. 24 shows a structure of a delay circuit according to an embodiment 14 of the invention. The delay circuit shown in FIG. 24 differs from the delay circuit shown in FIG. 20 in the following point. P-channel standard MOS transistor Pd, which is driven to the on/off states in accordance with the output signal of drive circuit DR2, is arranged between power supply node 1 and common ground line 3g, and output potential fixing MOS transistor Pcf is eliminated.

In the delay circuit shown in FIG. 24, the signal applied onto input node 5 is fixed to H-level during standby. In this state, the output signal of drive circuit DR2 is at L-level, and the common ground line 3g is electrically connected to power supply node 1 through MOS transistor Pd and carries the voltage at H-level. Common power supply line 3c is electrically connected to power supply node 1. During standby, therefore, both common ground line 3g and common power supply line 3c attain H-level, and the output node of each of inverters He–Hh is fixed to H-level. MOS transistor Naf is turned off, and the path of the leak current is cut off.

During the normal operation, the output signal of drive circuit DR2 changes at the cycle within which MOS transistor Naf is held at the on state, and the operation is performed in a manner similar to that of the delay circuit shown in FIG. 20. In the delay circuit shown in FIG. 24, if the input signal fixed to H-level is applied during standby, the operation merely fixing the common ground node of each inverter to H-level is performed, so that the components can be reduced in number, and the layout area can be reduced.

[Embodiment 15]

Figure 25:
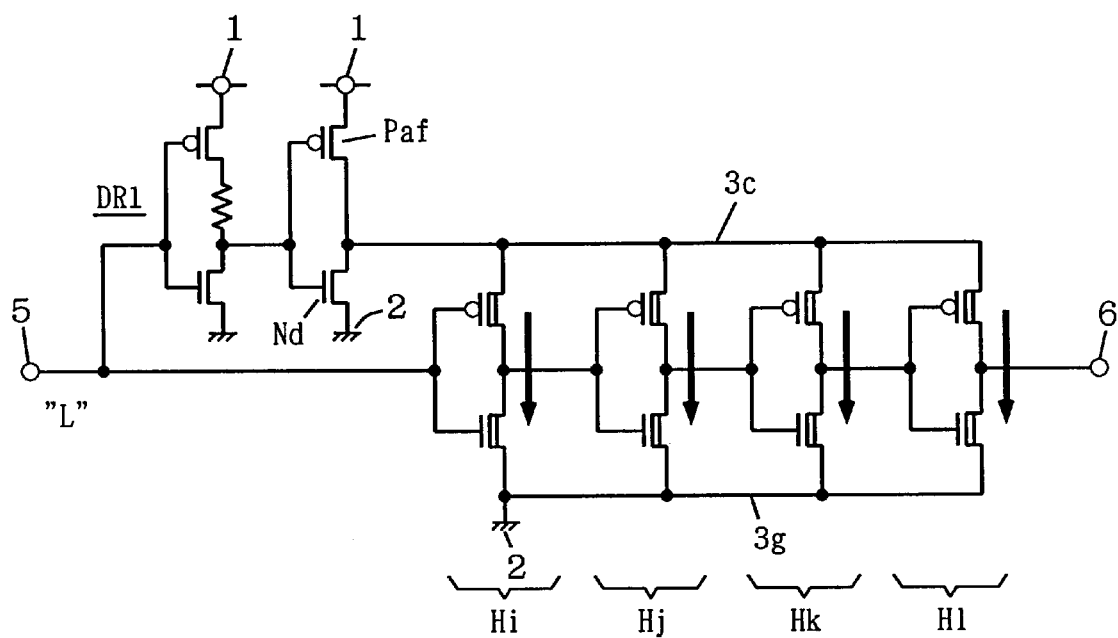
FIG. 25 shows a structure of a delay circuit according to an embodiment 15 of the invention.

FIG. 25 shows a structure of a delay circuit according to an embodiment 15 of the invention. The delay circuit shown in FIG. 25 differs from the delay circuit shown in FIG. 21 in the following point. N-channel standard MOS transistor Nd receiving on its gate the output signal of drive circuit DR1 is arranged between common power supply line 3c and ground node 2. N-channel standard MOS transistor Ncf for fixing the potential on output node 6 is not employed. The delay circuit shown in FIG. 25 fixes the potential levels on the output nodes of inverters Hi-Hl by fixing the potential on common power supply line 3c to L-level during standby instead of fixing the potential on the final output node 6.

In the delay circuit shown in FIG. 25, the input signal is held at L-level during standby. In this state, the output signal of drive circuit DR1 is at H-level, and common power supply line 3c is electrically connected to ground node 2 through standard MOS transistor Nd. Therefore, both common power supply line 3c and common ground line 3g attain the ground voltage level, and the output node of each of inverters Hi–Hl is fixed to L-level, so that each output node is prevented from electrical floating.

Owing to prevention of the electrical floating, such a problem can be prevented that an instable output signal is formed due to an influence by noises and adversely affects other circuits. Also, current source cut-off MOS transistor Paf suppresses the leak current during standby. Further, the circuit is provided with only the circuit portion for setting the potential level of common power supply line 3c, so that the circuit components can be reduced in number, and the layout area can be reduced.

[Embodiment 16]

Figure 26:
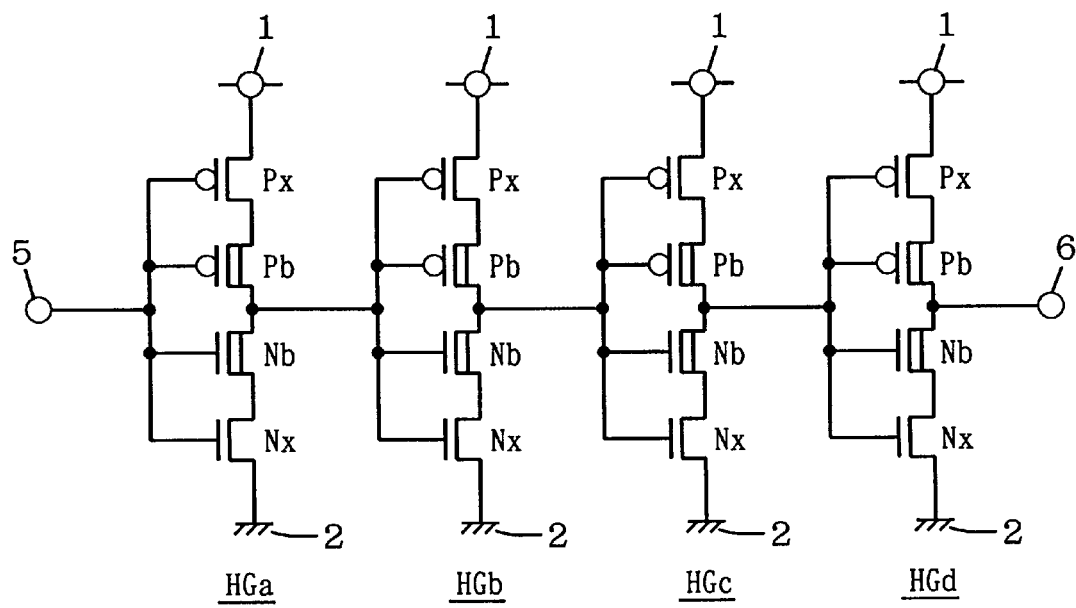
FIG. 26 shows a structure of a delay circuit according to an embodiment 16 of the invention.

FIG. 26 shows a structure of a delay circuit according to an embodiment 16 of the invention. The delay circuit shown in FIG. 26 includes four cascaded inverters HGa, HGb, HGc and HGd. Each of inverters HGa–HGd have the same structure from others, and includes MOS transistors Px, Pb, Nb and Nx which are connected in series between power supply node 1 and ground node 2 each receiving on its gate the output signal of the inverter at the immediately upstream inverter or the input signal on input node 5.

P-channel standard MOS transistor Px and p-channel low-Vth MOS transistor Pb are connected in series between power supply node 1 and the output node of the inverter. N-channel standard MOS transistor Nx and low-Vth MOS transistor Nb are connected between the output node of the inverter and ground node 2. Standard MOS transistor PX has the current driving capability sufficiently larger than the current driving capability of low-Vth MOS transistor Pb (i.e., has a sufficiently large ratio of a gate width W to a gate length L). Likewise, standard MOS transistor Nx has the current driving capability sufficiently larger than the current driving capability of low-Vth MOS transistor Nb.

In each of inverters HGa–HGd, the current driving capability of the output node depends on the current driving capabilities of the low-Vth MOS transistors.

Figure 27:
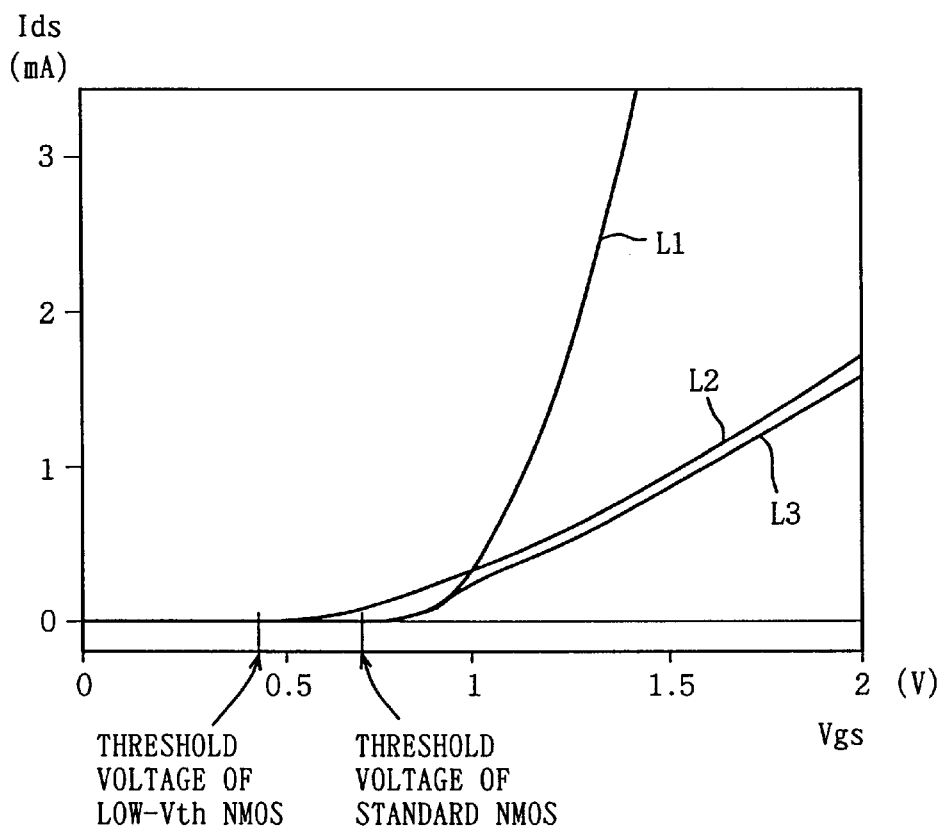
FIG. 27 shows an operation principle of the delay circuit shown in FIG. 26.

FIG. 27 shows a relationship between the gate-source voltage and the drain current of the standard MOS transistor and the low-Vth MOS transistor. The abscissa gives the gate-source voltage Vgs (V) and the ordinate gives the drain current Ids (mA). Curve L1 represents the drain current characteristic curve of the n-channel standard MOS transistor, and curve L2 represents the characteristic curve of the low-Vth MOS transistor. Curve L3 represents the drain current characteristic curve obtained by series connection of the n-channel standard MOS transistor and the low-Vth MOS transistor.

According to curves L1 and L2, the standard MOS transistor has the threshold voltage of about 0.7 V and the low-Vth MOS transistor has the threshold voltage of about 0.45 V. The current driving capability of the n-channel standard MOS transistor is sufficiently large and, for example, ten times larger than the current driving capability of the low-Vth MOS transistor. Therefore, when gate-source voltage Vgs exceeds the threshold voltage of the standard MOS transistor, drain current Ids rapidly increases as represented by curve L1. Since the current driving capability of the low-Vth MOS transistor is small, its drain current slowly rises even when gate-source voltage Vgs exceeds its threshold voltage as represented by curve L2.

In the structure including the standard MOS transistor and the low-Vth MOS transistor connected in series, the current, which is supplied from the standard MOS transistor when this standard MOS transistor is turned on, starts to flow, and then the current, which is defined by the drain current supplied from the low-Vth MOS transistor, flows.

Characteristic curve L3 is located under characteristic curve L2 of the low-Vth MOS transistor for the following reason. When standard MOS transistor and low-Vth MOS transistor are both turned on, a current flows from the output node of each of inverters HGa–HGd to ground node 2 in FIG. 26. In this operation, the source potential of the low-Vth MOS transistor is higher (floating-up) than the ground potential owing to the channel resistances of MOS transistors Nb and Nx, and the gate-source voltage is smaller, by a magnitude of the floating up or the source voltage with respect to the ground voltage, than the voltage applied to its gate, so that the drain current is small. This situation occurs even in the case where the positions of the low-Vth MOS transistor and the standard MOS transistor are exchanged. The drain potential lowers due to the channel resistance of the standard MOS transistor, and therefore the drain current also lowers (the conditions relating to the drain potential are the same in all the characteristic curves in FIG. 27).

According to the delay circuit shown in FIG. 26, therefore, the leak current path in each of inverters HGaHGd is cut off by standard MOS transistors Px and Nx during standby, and the leak current is suppressed. In the normal operation, the drive current of the output node is determined by low-Vth MOS transistors Pb and Nb. The magnitude of the drive current of this low-Vth MOS transistor has a small dependency on the power supply voltage, so that the delay circuit in which the dependency of the delay time on the power supply voltage is small can be achieved.

In the delay circuit shown in FIG. 26, the standard MOS transistor which has the conductivity type opposite to that of the low-Vth MOS transistor to be turned off, is on, and the output nodes of inverters HGa-HGd are always electrically connected to the power supply node 1 or ground node 2. Therefore, the electrical floating of the internal nodes and the output node are prevented.

[Embodiment 17]

Figure 28:
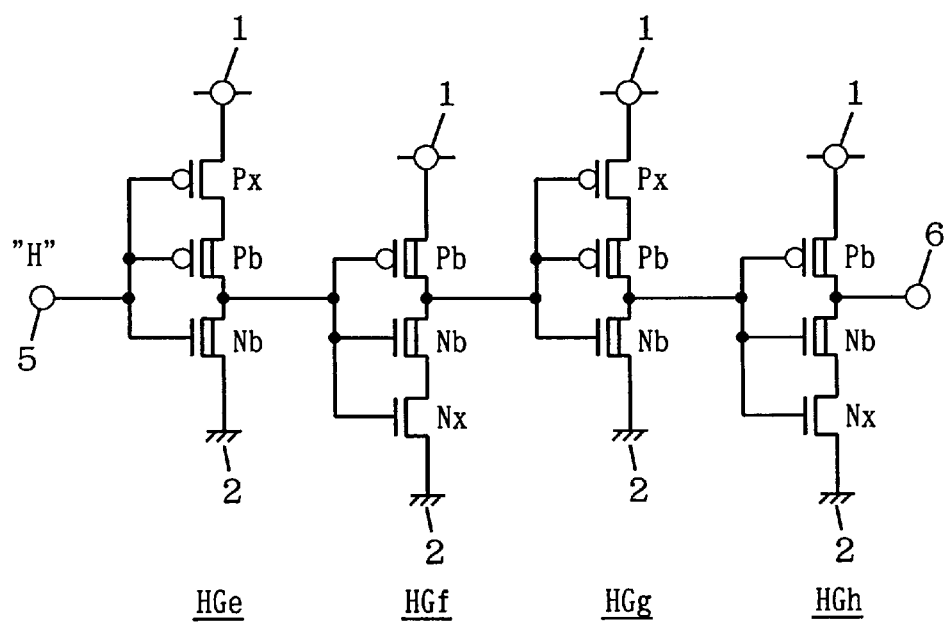
FIG. 28 shows a structure of a delay circuit according to an embodiment 17 of the invention.

FIG. 28 shows a structure of a delay circuit according to an embodiment 17 of the invention. In FIG. 28, the delay circuit includes four cascaded inverters HGe, HGf, HGg and HGh. In this delay circuit, input node 5 is supplied with the signal fixed to H-level during standby. The delay circuit shown in FIG. 28 differs from the delay circuit shown in FIG. 26 in the following point.

In inverters HGe and HGj at odd-numbered stages which receive signals at H-level during standby are not provided with the current source cut-off n-channel standard MOS transistor. Inverters HGf and HGh at even-numbered stages, which receive signals at L-level during standby, are not provided with the current source cut-off p-channel standard MOS transistor.

During standby, the leak current occurs only between the low-Vth MOS transistor in the off state and the power supply node (or ground node). During standby, particularly in the case where the signal potential level is fixed to H-level, the standard MOS transistors Px cut off the leak current paths in inverters HGe and HGg. Meanwhile, in inverters HGf and HGh which receive the signals at L-level during standby, standard MOS transistors Nx cut off the leak current paths thereof. In the normal operation, the output node of each of inverters HGe–HGh is driven to H-level or L-level in accordance with the current driving capability of the low-Vth MOS transistor. Thereby, the delay circuit in which the leak current during standby is small and the dependency on the power supply voltage is small, can be formed of a reduced number of components, which can reduce the layout area.

[Embodiment 18]

Figure 29:
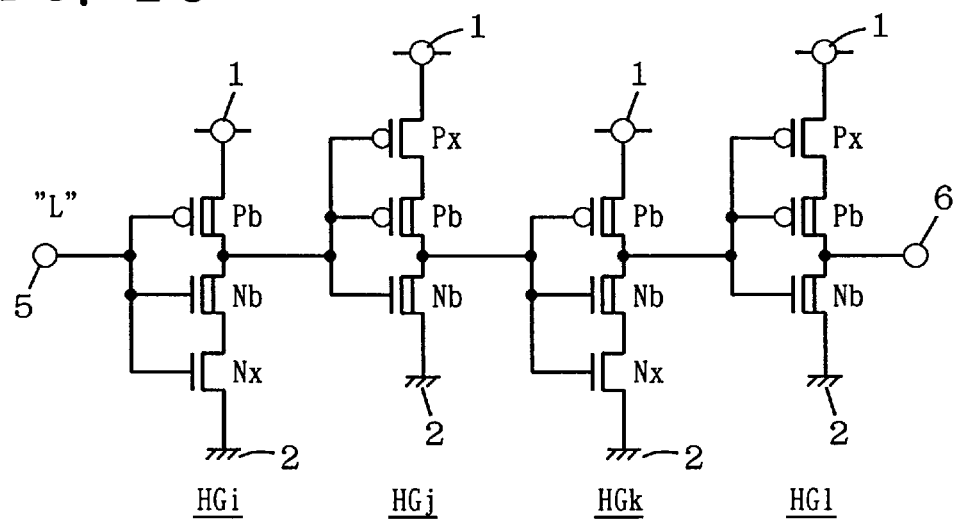
FIG. 29 shows a structure of a delay circuit according to an embodiment 18 of the invention.

FIG. 29 shows a structure of a delay circuit according to an embodiment 18 of the invention. In the delay circuit shown in FIG. 29, input node 5 is supplied with the signal fixed to L-level during standby. In order to cut off the leak current during standby, cascaded inverters HGi, HGj, HGk and HGl have such structures that inverters HGi and HGk at the odd-numbered stages receiving the signals at L-level during standby are not provided with current source cut-off standard p-channel MOS transistor Px, and inverters HGj and HGl at the even-numbered stages receiving the signals at H-level during standby are not provided with current source cut-off n-channel standard MOS transistor Nx.

The delay circuit shown in FIG. 29 differs from the delay circuit shown in FIG. 28 only in the logics of signals applied during standby. During standby, current source cut-off standard MOS transistor Px or Nx cuts off the leak current path. In operation, the output node of each inverter is driven in accordance with the current driving capability of the low-Vth MOS transistor. Similarly to the previous embodiments, therefore, the delay circuit shown in FIG. 29 can suppress the leak current during standby, and further can reduce the number of circuit components and the layout area.

[Embodiment 19]

Figure 30:
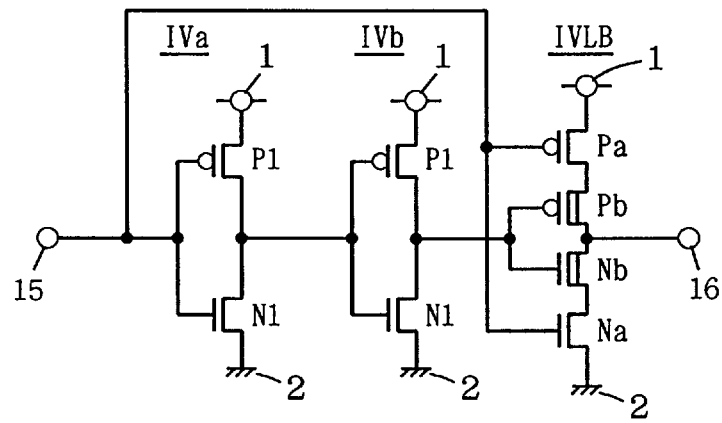
FIGS. 30 to 41 show structures of buffer circuits according to embodiments 19 to 30 of the invention, respectively.

FIG. 30 shows a structure of a semiconductor gate circuit according to an embodiment 19 of the invention. FIG. 30 shows a buffer circuit. The buffer circuit buffers an applied signal for wave-shaping and outputting, which point is a difference from the delay circuit already described. In this buffer circuit, therefore, if a delay time, i.e., a rising time and a falling time of a signal on an output node of the buffer circuit has a large dependency on the power supply voltage, the dependency of the input/output characteristics of the buffer circuit on the power supply voltage would be large, resulting in an unpreferable situation. In view of this, the description will now be given on the buffer circuit having a small dependency of the rising and falling times of the output signal on the power supply voltage.

In FIG. 30, the buffer circuit includes two cascaded CMOS inverters IVa and IVb receiving the signal applied onto input node 15 as well as one inverter buffer IVLB receiving the output signal of inverter IVb. Inverter IVLB includes p-channel standard MOS transistor Pa, p-channel low-Vth MOS transistor Pb, n-channel low-Vth MOS transistor Nb and n-channel standard MOS transistor Na which are connected in series between power supply node 1 and ground node 2. Standard MOS transistors Pa and Nc have gates connected to input node 15, and low-Vth MOS transistors Pb and Nb have gates receiving the output signal of inverter IVb.

The buffer circuit shown in FIG. 30 is equivalent to the structure of the delay circuit shown in FIG. 1A except for that the circuit includes only one delay stage. However, for minimizing the delay time, the current driving capabilities of MOS transistors Pa, Pb, Nb and Nc in inverter IVLB have larger current driving capabilities than those in the delay circuit. The circuit operation is the same as that of the delay circuit shown in FIG. 1A, and the signal on the output node 16 changes with the rising time and the falling time which depend on the current driving capabilities of low-Vth MOS transistors Pb and Nb. The dependency of the current driving capability of the low-Vth MOS transistor on the power supply voltage is small, and therefore the dependency of rising/falling times of the signal on output node 16 on the power supply voltage is extremely small. During standby, standard MOS transistors Pa and Na cut off the leak current path, and reduce the current consumption.

In the buffer circuit of the embodiment 19, the standard MOS transistors and the low-Vth MOS transistors are connected in series between the power supply node and the output node, and between the output node and the ground node, and the MOS transistor is turned on prior to shifting of the low-Vth MOS transistor to the on state. Therefore, the potential on output node changes at a speed depending on the current driving capability of the low-Vth MOS transistor, and it is possible to produce the signal which has rising/falling characteristics having a small dependency on the power supply voltage. Further, the leak current during standby can be cut off by the standard MOS transistor.

[Embodiment 20]

Figure 31:
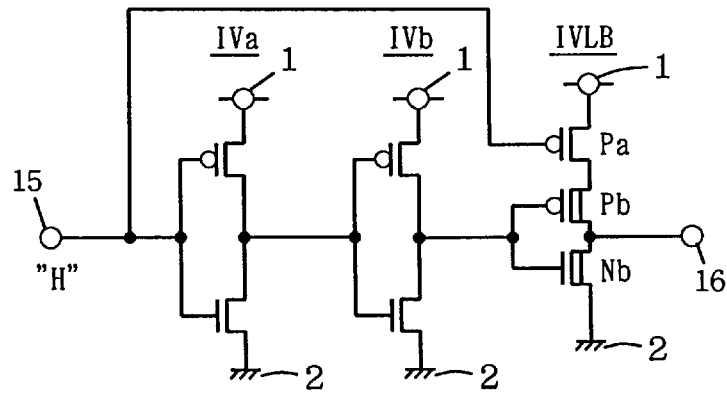

FIG. 31 shows a structure of a buffer circuit according to an embodiment 20 of the invention. In the buffer circuit shown in FIG. 31, input node 15 receives a signal at H-level during standby. For example, in a static random access memory, an externally applied chip select signal /CS is at H-level during standby. In a dynamic random access memory, external control signals such as a row address strobe signal /RAS, a column address strobe signal /CAS and a write enable signal /WE are at H-level during a standby cycle. For the buffer receiving such signals, it is not necessary to provide current source cut-off n-channel MOS transistor Na at inverter buffer IVLB in the final stage. In the structure shown in FIG. 31, standard MOS transistor Pa is off and cuts off the leak current path during standby. In the buffer circuit thus constructed, the current consumption is low, and the dependency of the signal state transition time on the power supply voltage is small.

[Embodiment 21]

Figure 32:
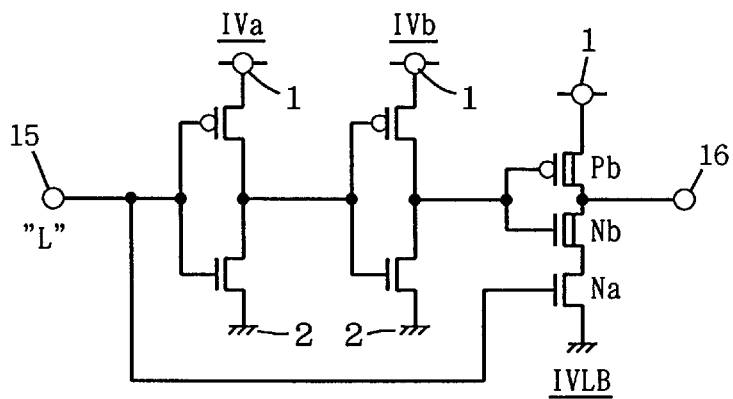

FIG. 32 shows a structure of a buffer circuit according to an embodiment 21 of the invention. The buffer circuit shown in FIG. 32 differs from the buffer circuit shown in FIG. 30 only in that inverter buffer IVLB at the final stage is not provided with p-channel standard MOS transistor Pa. Other structures are the same as that in FIG. 30.

In the buffer circuit shown in FIG. 32, input node 15 receives the signal at L-level during standby. During standby, it is the circuit portion receiving, e.g., an address transition detection signal that receives the signal at L-level.

In the buffer circuit shown in FIG. 32, standard MOS transistor Na is off and cuts off the leak current path during standby. The inverter buffer IVLB in the buffer circuit shown in FIG. 32 has the same structure as the inverter at the initial stage of the delay circuit shown in FIG. 7A, but has a different current driving capability. Thus, it is possible to provide the buffer circuit of which output transition time has a small dependency on the power supply voltage.

In the buffer circuits shown in FIGS. 30 to 32, inverters IVa and IVb are formed of CMOS inverters using standard MOS transistors. These inverters IVa and IVb generate output signals of which transition times have a dependency on the power supply voltage. However, these inverters IVa and IVb are required merely to drive inverter IVLB, and their output loads are small enough to allow fast operation, so that an influence by the dependency of the transition times on the power supply voltage can be substantially neglected.
[Embodiment 22]

Figure 33:
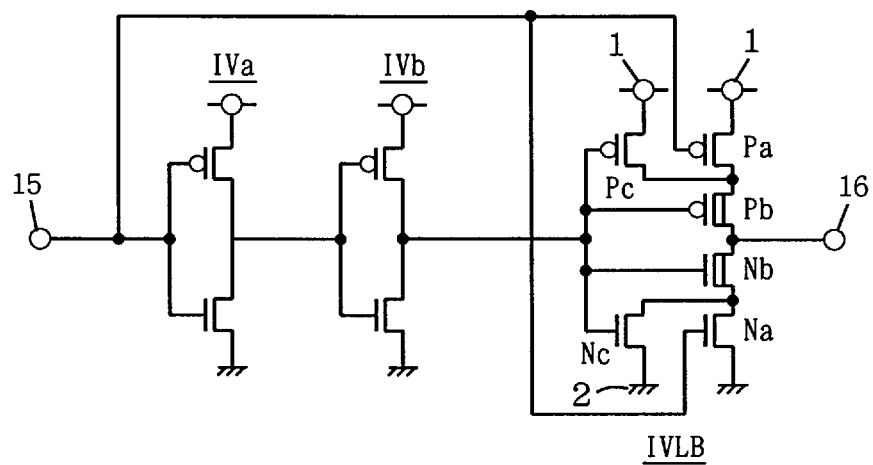

FIG. 33 shows a structure of a buffer circuit according to an embodiment 22 of the invention. The buffer circuit shown in FIG. 33 differs from the buffer circuit shown in FIG. 30 in the following point. In inverter IVLB, p-channel standard MOS transistor Pc receiving the output signal of inverter IVb is arranged between the connection node between MOS transistors Pa and Pb and power supply node 1, and n-channel standard MOS transistor Nc receiving on its gate the output signal of inverter IVb is arranged between the connection node between MOS transistors Na and Nb and ground node 2.

In the buffer circuit shown in FIG. 33, a forestalling signal from input node 15 controls the on/off states of standard MOS transistors Pa and Na. Similarly to the structure of the delay circuit shown in FIG. 8, therefore, there are provided standard MOS transistors Pc and Nc receiving on their gates the output signal of inverter IVb for preventing the electrical floating of the output node. The buffer circuit shown in FIG. 33 operates in the same manner as the delay circuit shown in FIG. 8 except for that the rising/falling times of the signal are shorter than those of the delay circuit in FIG. 8.
[Embodiment 23]

Figure 34:
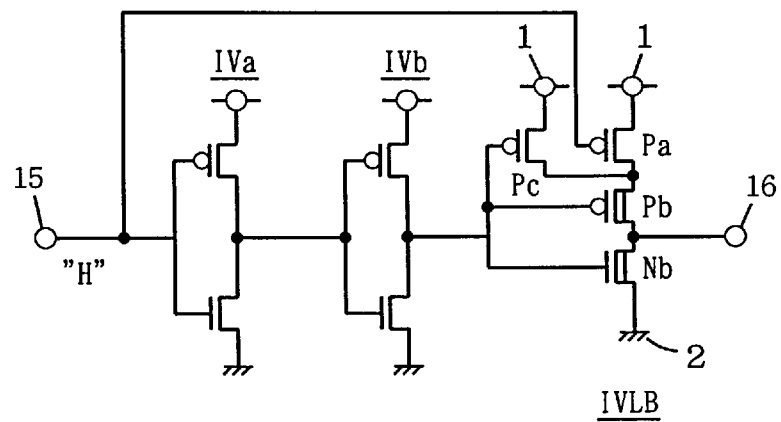

FIG. 34 shows a structure of a buffer circuit according to an embodiment 23 of the invention. In the buffer circuit shown in FIG. 34, input node 15 receives a signal fixed to H-level during standby. The buffer circuit shown in FIG. 34 differs from the buffer circuit shown in FIG. 33 only in that there is not provided standard MOS transistors Na and Nc.

During standby, the leak current may flow only in p-channel low-Vth MOS transistor Pb when the signal fixed to H-level is applied. In view of this, standard MOS transistor Pa is arranged between power supply node 1 and output node 16. During transitions of the output signal, a period for which all MOS transistors Pa and Nb are off is present while the input signal applied to inverter buffer IVLB rises from L-level to H-level. At this time, p-channel standard MOS transistor Pc for fixing the potential maintains the on state, and prevents generation of noises which may be caused by capacitive coupling due to electrical floating of output node 16.

Similarly to the previous embodiments, the buffer circuit shown in FIG. 34 can reduce the leak current during standby, can reduce the number of components, and can produce the output signal of which rising/falling times have a small dependency on the power supply voltage.
[Embodiment 24]

Figure 35:
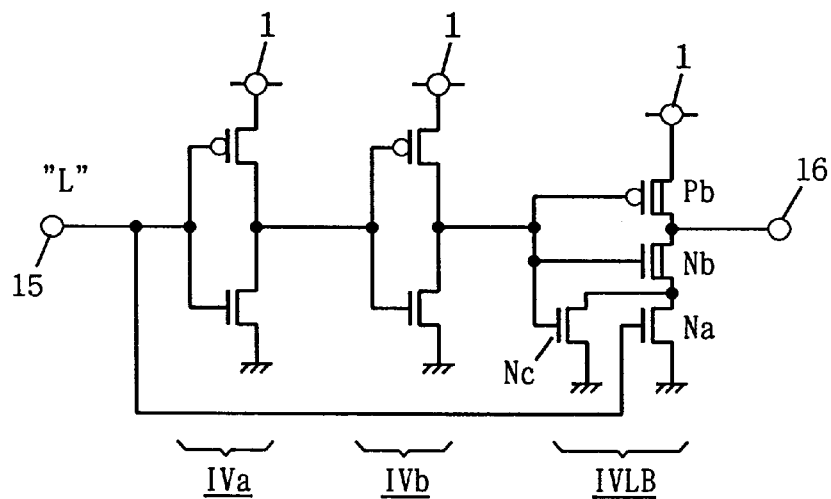

FIG. 35 shows a structure of a buffer circuit according to an embodiment 24 of the invention. The buffer circuit shown in FIG. 35 differs from the buffer circuit shown in FIG. 33 in that inverter buffer IVLB does not include p-channel standard MOS transistors Pa and Pc. Other structures are the same as that shown in FIG. 33.

In the buffer circuit shown in FIG. 35, the signal applied onto input node 15 is fixed to L-level during standby. During standby, the buffer circuit shown in FIG. 35 operates in the same manner as that of the buffer circuit shown in FIG. 32. When the input signal applied to inverter buffer IVLB falls from H-level to L-level, all MOS transistors Pb and Na may be turned off. Even in this case, n-channel standard MOS transistor Nc is set to the on state so as to prevent electrical floating of output node 16 during transition of this input signal.

By employing the structure shown in FIG. 35, it is possible to provide the buffer circuit in which the number of circuit components and the layout area are reduced, and the leak current during standby is also reduced. It is also possible to prevent electrical floating of output node 16, and produce the output signal having a stable waveform without a noise.
[Embodiment 25]

Figure 36:
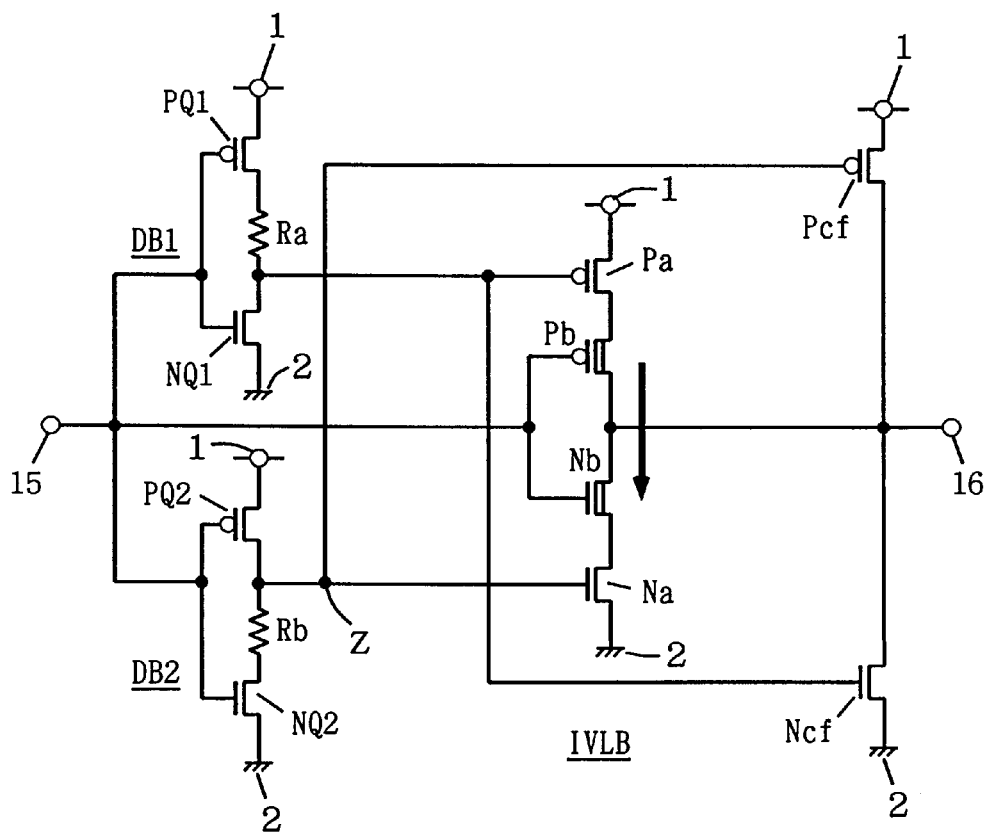

FIG. 36 shows a structure of a buffer circuit according to an embodiment 25 of the invention. In FIG. 36, the buffer circuit includes an inverter buffer IVLB receiving the signal applied onto input node 15. Inverter buffer IVLB includes p-channel standard MOS transistor Pa, p-channel low-Vth MOS transistor Pb, n-channel low-Vth MOS transistor Nb and n-channel standard MOS transistor Na which are connected in series between power supply node 1 and ground node 2. Low-Vth MOS transistors Pb and Nb have gates electrically coupled to input node 15. Standard MOS transistors Pa and Pb receive the output signals of drive circuits DB1 and DB2 receiving the signal on input node 15, respectively. Drive circuit DB1 includes MOS transistors PQ1 and NQ1 as well as resistance element Ra, and generates an output signal having a rising speed slower than a falling speed thereof. Drive circuit DB2 includes MOS transistors PQ2 and NQ2 as well as resistance element Rb, and generates an output signal having a falling speed slower than a rising speed thereof.

This buffer circuit further includes a p-channel standard MOS transistor Pcf, which is turned on, when the output signal of drive circuit DB2 is at L-level, to electrically couples power supply node 1 and output node 16 together, and an n-channel standard MOS transistor Ncf, which is turned on, when the output signal of drive circuit DB1 is at H-level, to electrically couple output node 16 and ground node 2 together.

The buffer circuit shown in FIG. 36 corresponds to the structure of the delay circuit shown in FIG. 17. Inverter buffer IVLB shown in FIG. 36 has a larger current driving capability than that of the component included in the delay circuit shown in FIG. 17, and provides the buffer function. In the buffer circuit shown in FIG. 36, therefore, MOS transistors Pa and Na cut off the leak current path during standby, similarly to the previous embodiment.

Figure 18:
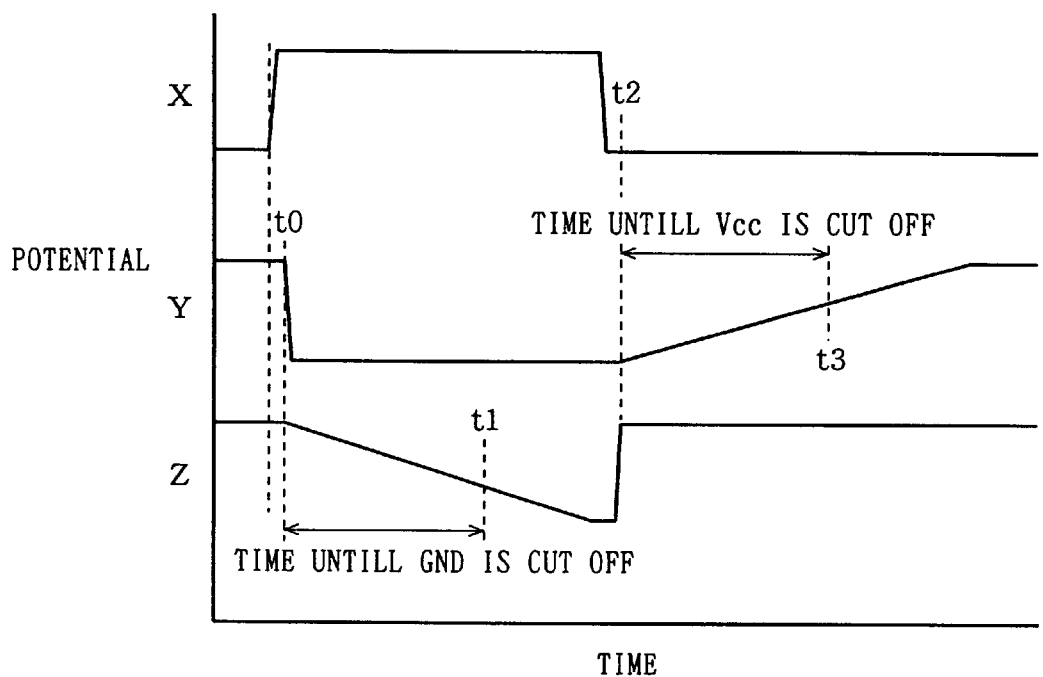
FIG. 18 is a signal waveform diagram representing an operation of the delay circuit shown in FIG. 17.

During normal operation, the buffer circuit receives a signal which changes more rapidly than rising and falling of the output signals of drive circuits DB1 and DB2, and standard MOS transistors Pa and Na maintain the on state (see FIG. 18). MOS transistors Pcf and Ncf for fixing the output potential are driven to the on/off states in accordance with the output signals of drive circuits DB1 and DB2 during operation of inverter buffer IVLB.

These potential fixing MOS transistors Pcf and Ncf are provided for fixing the potential on output node 16 during standby. When input node 15 is fixed, for example, to H-level, inverter buffer IVLB operates such that standard MOS transistor Na is off and low-Vth MOS transistor Pb is off. Only the subthreshold leak current flows, and therefore output node 16 is floated. In this state, standard MOS transistor Pcf is turned on in accordance with the output signal of drive circuit DB2, and maintains output node 16 at H-level.

By using the inverter buffer shown in FIG. 36, for example, in a clock synchronous memory device, and particularly in a circuit portion receiving an externally applied clock signal, it is possible to implement the buffer circuit which can operate with a reduced current consumption during standby (e.g., in an operation mode such as a sleep mode during which the clock signal is not applied), and can perform a fast operation.

[Embodiment 26]

Figure 37:
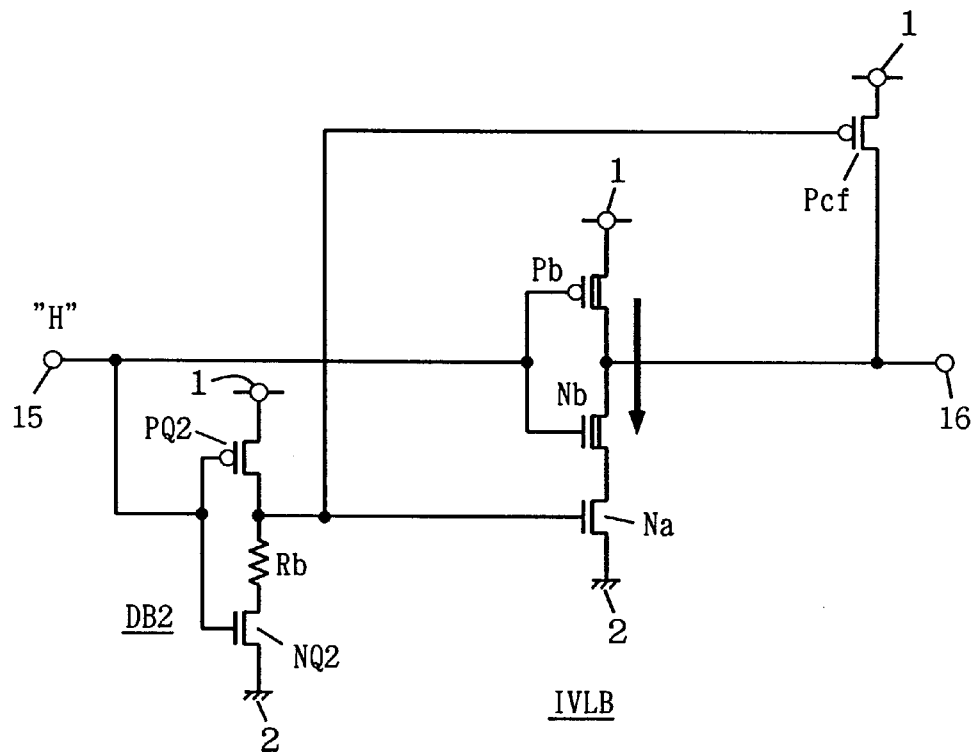

FIG. 37 shows a structure of a buffer circuit according to an embodiment 26 of the invention. The buffer circuit shown in FIG. 37 differs from the buffer circuit shown in FIG. 36 in the following point. There is not provided drive circuit DB1, current source cut-off p-channel standard MOS transistor Pa and output potential fixing n-channel standard MOS transistor Ncf.

The signal applied onto input node 15 is at H-level during standby. During standby, the output signal of drive circuit DB2 is at L-level, and standard MOS transistor Na is off and cuts off the leak current path from power supply node 1 to ground node 2. In this state, low-Vth MOS transistor Pb is turned off. A subthreshold leak current flows through low-Vth MOS transistor Pb. At this time, output node 16 is electrically connected to power supply node 1 through standard MOS transistor Pcf which is turned on. Accordingly, output node 16 is fixed to H-level and is prevented from floating.

According to the structure of the buffer circuit shown in FIG. 37, it is known, in advance, that the logical level of the signal during standby is at H-level. Owing to this, the number of circuit components and therefore the layout area can be reduced. Also, the leak current during standby can be reduced.

Further, it is possible to prevent such a disadvantage that the output node is electrically floated during standby and the output signal is in an instable state due to an influence of noises and the like to adversely affect a circuit in a next stage.

[Embodiment 27]

Figure 38:
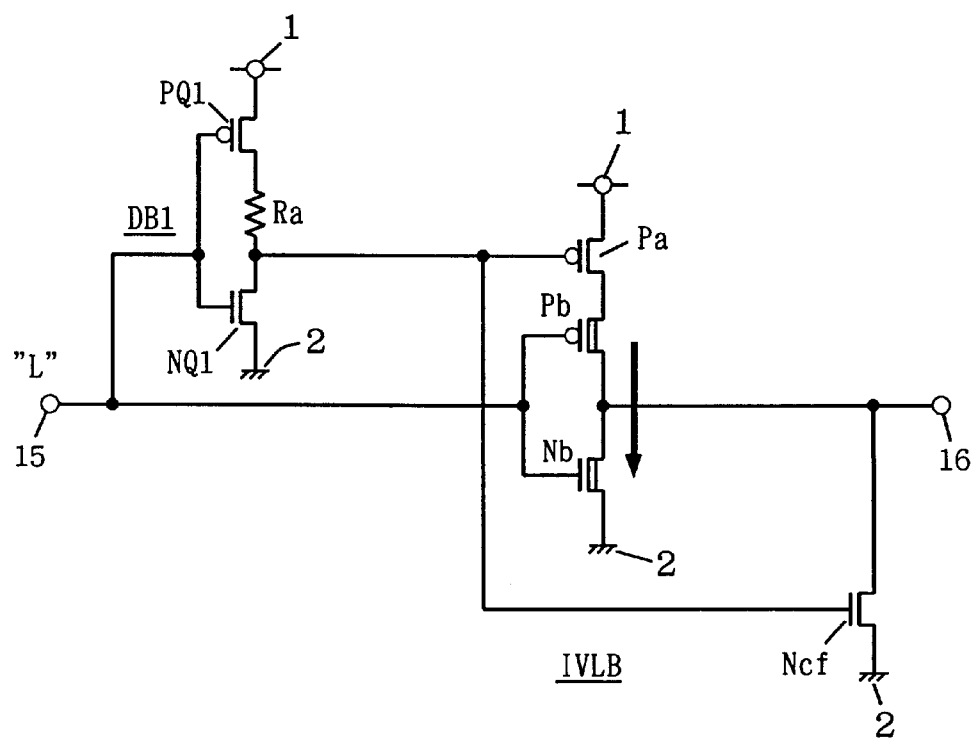

FIG. 38 shows a structure of a buffer circuit according to an embodiment 27 of the invention. The buffer circuit shown in FIG. 38 differs from the buffer circuit shown in FIG. 36 in the following point. There is not provided drive circuit DB2, current source cut-off n-channel standard MOS transistor Na and potential fixing p-channel standard MOS transistor Pcf.

The signal applied onto input node 15 is at L-level during standby. During standby, the output signal of drive circuit DB1 is at H-level, and standard MOS transistor Pa is off so that the current path from power supply node 1 to ground node 2 is cut off. MOS transistors Pa and Nb are substantially off. However, standard MOS transistor Ncf is turned on in accordance with the output signal of drive circuit DB1 and fixes output node 16 to the ground voltage level, i.e., L-level. Accordingly, it is possible to prevent the electrical floating of output node 16.

In the buffer circuit shown in FIG. 38, the number of circuit components and therefore the layout area can be reduced if the logical level of the input signal during standby is determined in advance, similarly to the previous embodiment.

[Embodiment 28]

Figure 39:
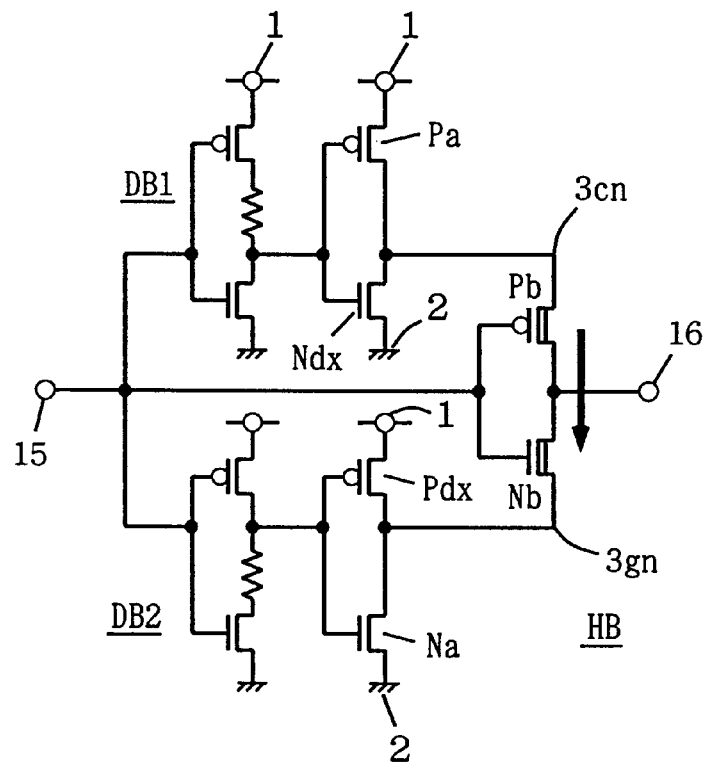

FIG. 39 shows a structure of a buffer circuit according to an embodiment 28 of the invention. This buffer circuit differs from the structure shown in FIG. 36 in the following point. An n-channel standard MOS transistor Ndx receiving on its gate the output signal of drive circuit DB1 is arranged between a connection node 3cn between MOS transistors Pa and Pb and ground node 2, and a p-channel standard MOS transistor Pdx receiving on its gate the output signal of drive circuit DB2 is arranged between a connection node 3gn between MOS transistors Na and Nb and power supply node 1. A potential fixing MOS transistor for fixing the potential on output node 16 is not employed.

According to the structure of the buffer circuit shown in FIG. 39, particularly during standby, the output signals of drive circuits DB1 and DB2 are at the same logical level, so that both MOS transistors Pa and Pdx are on or both MOS transistors Ndx and Na are on. Therefore, nodes 3cn and 3gn are fixed to the power supply voltage level or ground voltage level during standby. Owing to this, even if one of low-Vth MOS transistors Pb and Nb is on and the other is off during standby, nodes 3cn and 3gn thereof are at the same potential level, and a leak current which may flow can be reliably suppressed, because a current path to a node different from a node, which is electrically connected through an on-state low Vth MOS transistor to a connection node 3cn or 3gn, is cut off in accordance with the output signals of drive circuits DB1 and DB2, and the current path from power supply node 1 to ground node 2 is cut off, so that the leak current path is cut off. In the buffer circuit shown in FIG. 39, one of low-Vth MOS transistors Pb and Nb is on, so that electrical floating of output node 16 can be prevented.

[Embodiment 29]

Figure 40:
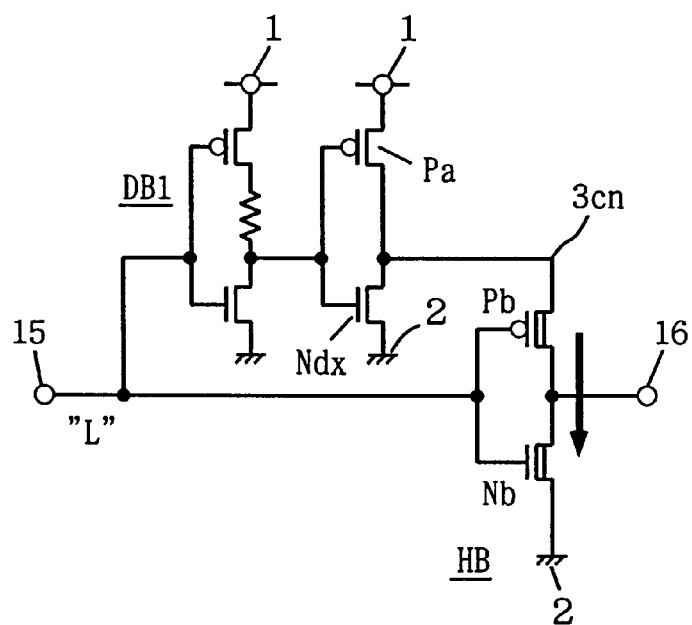

FIG. 40 shows a structure of a buffer circuit according to an embodiment 29 of the invention. The buffer circuit shown in FIG. 40 differs from the buffer circuit shown in FIG. 39 in the following point. There is not provided drive circuit DB2, potential fixing p-channel standard MOS transistor Pdx and current source cut-off n-channel standard MOS transistor Na. The source of n-channel low-Vth MOS transistor Nb in inverter IVLB is electrically connected to ground node 2. The signal applied onto input node 15 is fixed to L-level during standby. During standby, the output signal of drive circuit DB1 is at H-level, and connection node 3cn is held at ground voltage level. Standard MOS transistor Pa is off. Therefore, the leak current path from power supply node 1 to ground node 2 is not present, and the output node 16 is fixed to the ground voltage level.

According to the buffer circuit shown in FIG. 40, the circuit components can be reduced in number in accordance with the logical level of the input signal on input node 15 during standby, and the layout area can be reduced.

[Embodiment 30]

Figure 41:
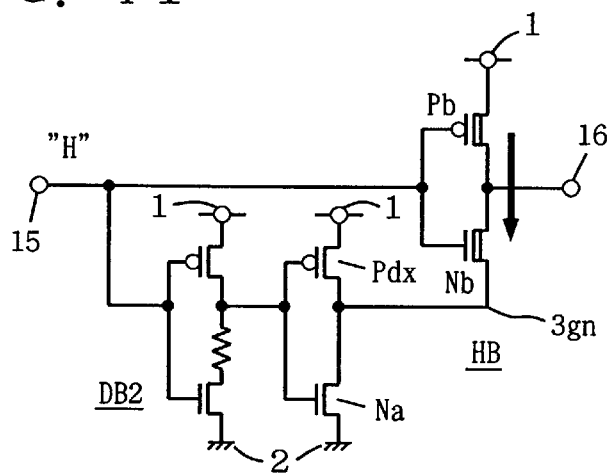

FIG. 41 shows a structure of a buffer circuit according to an embodiment 30 of the invention. The buffer circuit shown in FIG. 41 differs from the buffer circuit shown in FIG. 39 in the following point. There is not provided drive circuit DB1, standard MOS transistor Pa for cutting off current source and n-channel standard MOS transistor Ndx for fixing the potential on connection node. In inverter buffer IVLB, the source of p-channel low-Vth MOS transistor is electrically and directly connected to power supply node 1.

In the structure of the buffer circuit shown in FIG. 41, the signal applied onto input node 15 is fixed to H-level during standby. Thereby, the output signal of drive circuit DB2 attains L-level, and connection node 3gn is connected to power supply node 1 through standard MOS transistor Pd.

Therefore, both power supply node 1 and connection node 3gn attain the power supply voltage level, and a leak current flowing through low-Vth MOS transistors Pb and Nb is not caused. Output node 16 is fixed to H-level. Connection node 3gn is connected to ground node 2 through standard MOS transistor Naf in the off state, and the path of the leak current which may flow from power supply node 1 to ground node 2 (due to low-Vth MOS transistor Pb) is cut off.

In the buffer circuit shown in FIG. 41, the circuit components can be reduced in number in accordance with the voltage level of the input signal during standby, and therefore the layout area can be reduced.

[Embodiment 31]

Figure 42A:
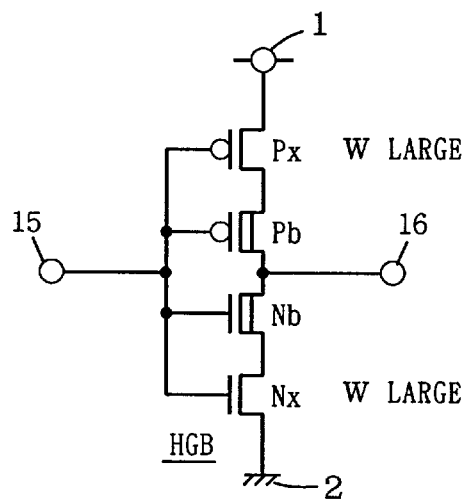
FIG. 42A shows a structure of a buffer circuit according to an embodiment 31 of the invention.

FIG. 42A shows a structure of a buffer circuit according to an embodiment 31 of the invention. In FIG. 42A, the buffer circuit includes one inverter buffer HGB arranged between input node 15 and output node 16. Inverter buffer HGB includes MOS transistors Px, Pb, Nb and Nx connected in series between power supply node 1 and ground node 2. The current driving capabilities (ratios of gate widths to gate lengths) of p-channel standard MOS transistor Px and n-channel standard MOS transistor Nx are sufficiently larger than those of p-channel low-Vth MOS transistor Pb and n-channel low-Vth MOS transistor Nb. The buffer circuit shown in FIG. 42A corresponds to the structure of the delay circuit shown in FIG. 26. The circuit shown in FIG. 42A is a buffer circuit, in which a delay period is made as small as possible.

In the buffer circuit shown in FIG. 42A, the drive speed of output node 16 depends on the current driving capabilities of low-Vth MOS transistors Pb and Nb. Owing to the current driving capabilities of the low-Vth MOS transistors having a small dependency on the power supply voltage, it is possible to reduce the dependency of the rising/falling times of the output signal on the power supply voltage. Standard MOS transistors Px and Nx supply the drain currents having a dependency on the power supply voltage. However, the current driving capabilities thereof are sufficiently larger than the current driving capabilities of the low-Vth MOS transistors. Therefore, in spite of the fact that standard MOS transistors Px and Nx have the dependency on the power supply voltage, the current driving capabilities of the standard MOS transistors are sufficiently larger than the current driving capabilities of the low-Vth MOS transistors. Accordingly, the dependency of the amounts of current supplied by low-Vth MOS transistors on the power supply voltage does not affect the rising/falling times of the output signal on the output node 16. When the off state is to be attained, standard MOS transistor Px or Nx is turned off, so that the leak current path can be reliably cut off, and the leak current can be significantly suppressed during standby.

[Modification 1]

Figure 42B:
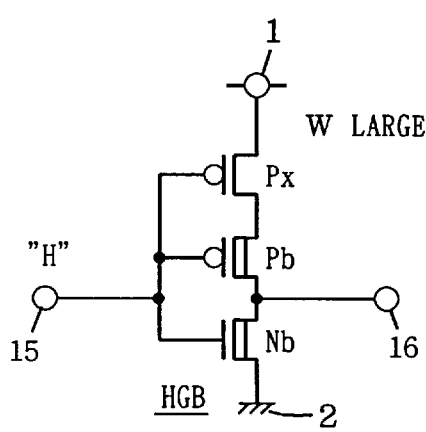
FIGS. 42B and 42C show structures of modifications of the embodiment 31 of the invention, respectively.

FIG. 42B shows a structure of a modification 1 of the embodiment 31 of the invention. In inverter buffer HGB shown in FIG. 42B, the source of n-channel low-Vth MOS transistor Nb is electrically connected to ground node 2. Thus, standard MOS transistor Nx is eliminated from the inverter buffer shown in FIG. 42A. In the buffer circuit including inverter buffer HGB shown in FIG. 42B, the signal applied onto input node 15 is fixed to H-level during standby. Therefore, standard MOS transistor Px which is off during standby is connected to p-channel low-Vth MOS transistor Pb through which the leak current flows, so that the leak current is cut off. Even in this state, the charging and discharging currents of the output node 16 depend on the current driving capability of the low-Vth MOS transistor, and therefore it is possible to achieve the buffer circuit in which the dependency on the power supply voltage is small and the leak current during standby is small.

[Modification 2]

Figure 42C:
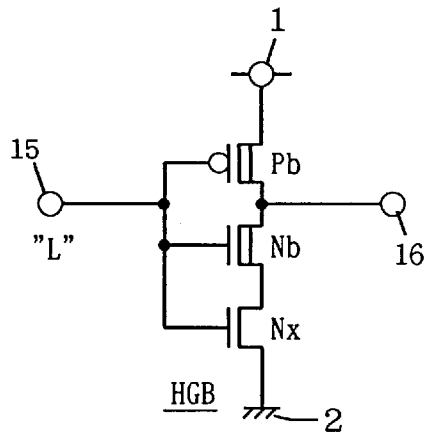
Figure 43:
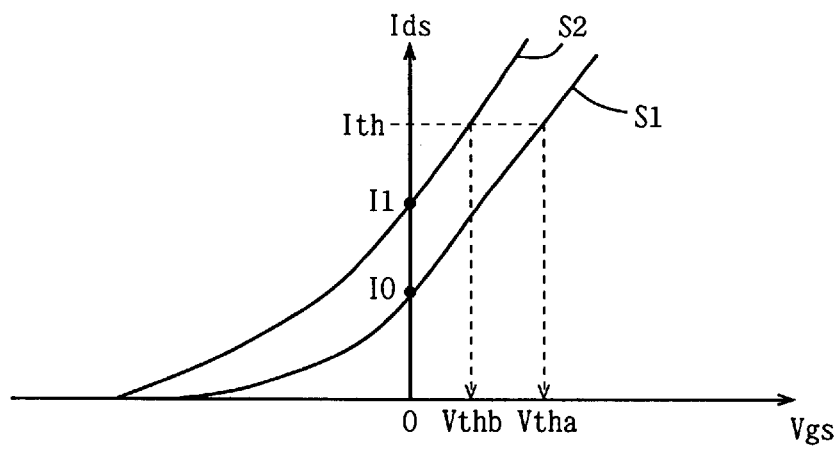
FIG. 43 is a diagram for showing a subthreshold leak current of a MOS transistor.
Figure 44:
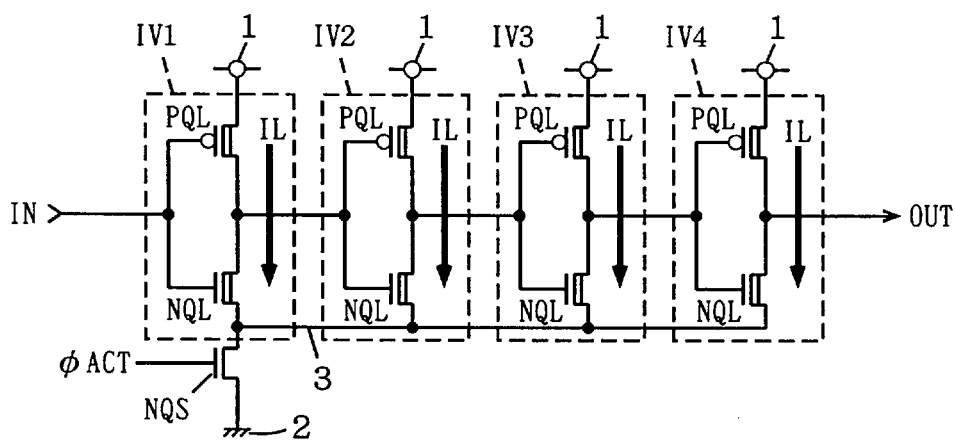
FIG. 44 shows a structure of a delay circuit in the prior art.
Figure 45:
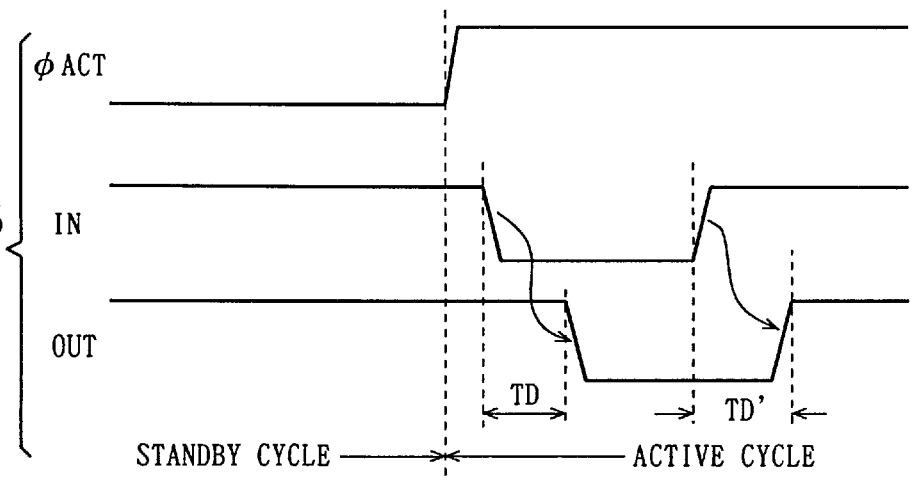
FIG. 45 is a signal waveform diagram representing an operation of the delay circuit shown in FIG. 44.
Figure 46:
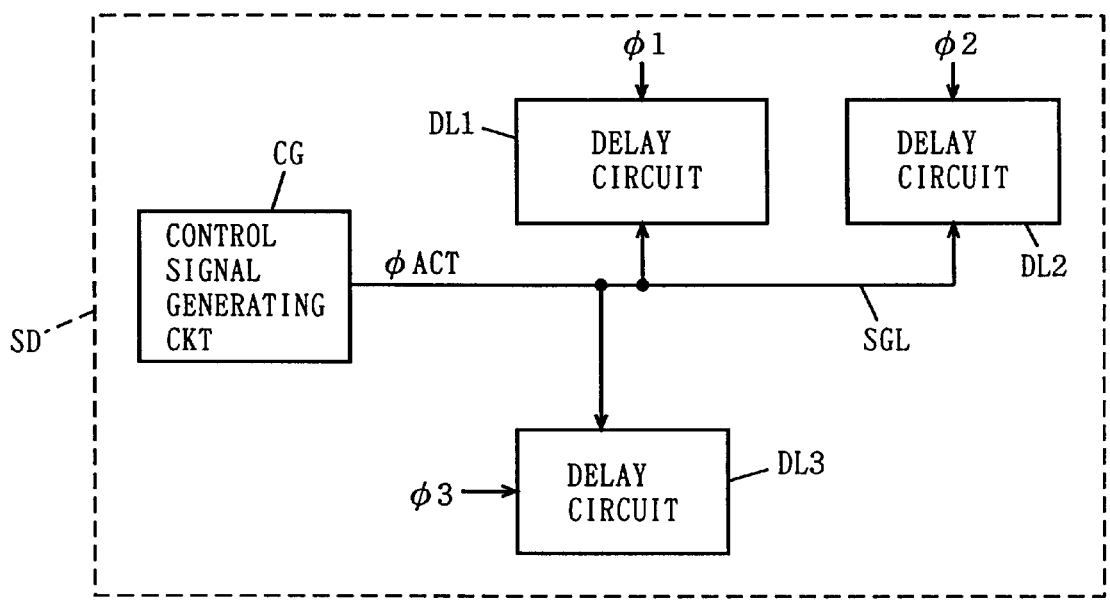
FIG. 46 is a diagram illustrating a problem of the delay circuit in the prior art.
Figure 47:
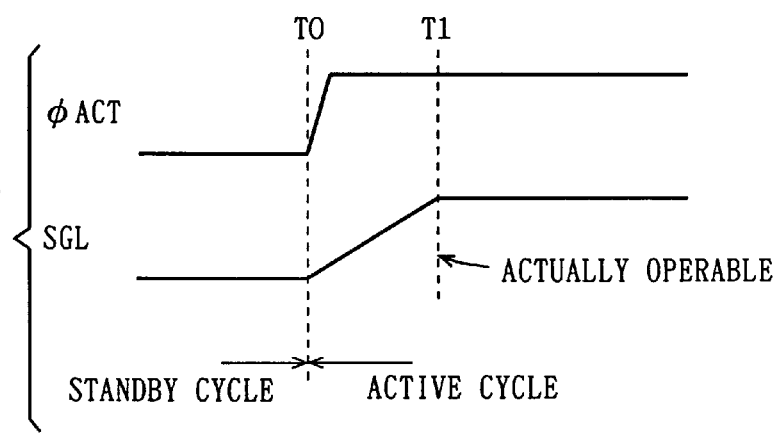
FIG. 47 shows internal signals in a semiconductor device shown in FIG. 47.

FIG. 42C shows a structure of a modification 2 of the embodiment 31 of the invention. The buffer circuit shown in FIG. 42C differs from the circuit shown in FIG. 42A. The source of p-channel low-Vth MOS transistor Pb is electrically and directly connected to power supply node 1. In the structure shown in FIG. 42C, the signal applied onto input node 15 is fixed to L-level during standby. Therefore, n-channel standard MOS transistor Nx for cutting off the leak current is provided for n-channel low-Vth MOS transistor Nb through which the leak current flows during standby. Thereby, it is possible to provide a buffer circuit in which a leak current during standby is suppressed and the circuit components are reduced in number.

In the delay circuit described above, the delay inverters are four in number. However, this number is not limitative, and an appropriate number of delay inverters may be employed depending on the delay period to be achieved. Also, it is not essential that the buffer circuit is formed of only one inverter buffer, and an even number of inverter buffers may be cascaded depending on the logic of the buffer circuit.

The standard MOS transistors and the low-Vth MOS transistors may be connected with the positions exchanged.

According to the invention, as described above, the semiconductor gate circuit such as the delay circuit or the buffer circuit has such a structure that the low-Vth MOS transistor supplies the drive current onto the output node, and the leak current during standby is cut off by the standard MOS transistor. Therefore, it is possible to achieve the semiconductor gate circuit, in which the dependency of input/output characteristics on the power supply voltage is small and the leak current during standby is significantly reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor gate circuit comprising:
   a plurality of cascaded inverters each inverting a received signal for outputting, at least one of said plurality of cascaded inverters including:
   a first input node,
   a first output node, and
   first and second insulated gate field-effect transistors of a first conductivity type coupled in series between a first power supply node supplying a voltage at a first logical level and the first output node,
   said first insulated gate field-effect transistor having a first threshold voltage, and said second insulated gate field-effect transistor having a second threshold voltage smaller in absolute value than said first threshold voltage, and
   said first and second insulated gate field-effect transistors being turned on, when a signal applied onto said first input node is at a second logical level, to form a current path between said first power supply node and said first output node for outputting a signal at the first logical level.

2. The semiconductor gate circuit according to claim 1, wherein
   said first insulated gate field-effect transistor receives on a gate -thereof a signal preceding in phase the signal applied onto said first input node, and said second insulated gate field-effect transistor receives on a gate thereof the signal on said first input node.

3. The semiconductor gate circuit according to claim 1, further comprising a first potential fixing insulated gate field-effect transistor of the first conductivity type coupled between a connection node between said first insulated gate field-effect transistor and said second insulated gate field-effect transistor and said first power supply node, and receiving on a gate thereof the signal applied onto said first input node.

4. The semiconductor gate circuit according to claim 1, wherein
said at least one inverter further includes a third insulated gate field-effect transistor of a second conductivity type coupled between said first output node and a second power supply node supplying a voltage at the second logical level, and receiving on a gate thereof a signal on said first input node, said third insulated gate field-effect transistor has a threshold voltage smaller in absolute value than said first threshold voltage of said first insulated gate field-effect transistor.

5. The semiconductor gate circuit according to claim 1, wherein
said at least one inverter further includes third and fourth insulated gate field-effect transistors of a second conductivity type coupled in series between said first output node and a second power supply node supplying a voltage at the second logical level, said third insulated gate field-effect transistor having a threshold voltage smaller in absolute value than a threshold voltage of said fourth insulated gate field-effect transistor, said third insulated gate field-effect transistor receiving on a gate thereof the signal on said first input node, and said fourth insulated gate field-effect transistor receiving on a gate thereof the same signal as the signal received by said first insulated gate field-effect transistor on a gate thereof.

6. The semiconductor gate circuit according to claim 5, wherein
said at least one inverter further includes a second potential fixing insulated gate field-effect transistor of the second conductivity type coupled between a connection node between the third and fourth insulated gate field-effect transistors and said second power supply node, and receiving on a gate thereof the signal applied onto said first input node.

7. The semiconductor gate circuit according to claim 1, wherein
said at least one inverter includes the inverters among said plurality of inverters arranged at alternate stages in the cascade, and said first insulated gate field-effect transistor is provided commonly for said inverters arranged at the alternate stages and receives a signal advancing in phase the signal at the first input node of each of the inverters.

8. The semiconductor gate circuit according to claim 5, wherein
said at least one inverter includes the inverters among said plurality of inverters arranged at alternate stages in the cascade, and said fourth insulated gate field-effect transistor is provided commonly for said inverters arranged at the alternate stages and receives a signal advancing in phase the signal at the first input node of each of the inverters.

9. The semiconductor gate circuit according to claim 1 wherein
each of said first and second insulated gate field-effect transistors receives on a gate thereof the signal on said first input node, and said first insulated gate field-effect transistor has a current driving capability larger than a current driving capability of said second insulated gate field-effect transistor under the condition of the same voltage applied between each respective gate electrode and each respective source electrode.

10. The semiconductor gate circuit according to claim 9, wherein
said at least one inverter further includes third and fourth insulated gate field-effect transistors of a second conductivity type connected in series between said first output node and a second power supply node supplying a voltage at the second logical level,
said third insulated gate field-effect transistor has a threshold voltage smaller in absolute value than a threshold voltage of said fourth insulated gate field-effect transistor, and
said third insulated gate field-effect transistor has a current driving capability smaller than a current driving capability of said fourth insulated gate field-effect transistor under the condition of the same voltage applied between each respective gate and each respective source.

11. The semiconductor gate circuit according to claim 9, wherein
said at least one inverter further includes a third insulated gate field-effect transistor of a second conductivity type coupled between said first output node and a second power supply node supplying a voltage at the second logical level, and said third insulated gate field-effect transistor has a threshold voltage smaller in absolute value than a threshold voltage of said first insulated gate fieldeffect transistor.

12. A semiconductor gate circuit comprising;
at least one inverter arranged between an input node and an output node each for inverting a received signal, said at least one inverter including first and second insulated gate field-effect transistors connected in series between a first node and a second node and having first and second conductivity types, respectively;
first control inverter for inverting a signal on said input node, said first control inverter including first and second control insulated gate field-effect transistors having first and second conductivity types, respectively and each having a threshold voltage larger in absolute value than threshold voltages of said first and second insulated gate field-effect transistor, said first control inverter further including means, coupled to the first and second control insulated gate field-effect transistors, for setting a speed of change of an output signal of said first control inverter from a first logical level to a second logical level to be faster than a speed of change of the same from the second logical level to the first logical level; and
a third insulated gate field-effect transistor of the first conductivity type coupled between said first node and a first power supply node supplying a voltage at said first logical level, and receiving on a gate thereof an output signal of said first control inverter.

13. The semiconductor gate circuit according to claim 12, further comprising:
a fourth insulated gate field-effect transistor of the second conductivity type coupled between said second node and a second power supply node supplying a voltage at said second logical level, and having a threshold voltage larger in absolute value than those of said first and second insulated gate field-effect transistors; and a second control inverter applying an output signal thereof to a gate of said fourth insulated gate field-effect transistor in accordance with the signal applied onto said input node, said second control inverter including third and fourth control insulated gate field-effect transistors having first and second conductivity types, respectively, and having threshold voltages larger in absolute value than those of said first and second insulated gate field-effect transistors, said second control inverter further including means coupled to the third and fourth control insulated gate field-effect transistors, for setting a speed of change of the output signal of said second control inverter from said first logical level to said second logical level to be slower than a speed of change of the same from said second logical level to said first logical level.

14. The semiconductor gate circuit according to claim 12, further comprising:

a fourth insulated gate field-effect transistor of the second conductivity type coupled between said output node and a second power supply node supplying a voltage at the second logical level, and receiving on a gate thereof the output signal of said first control inverter.

15. The semiconductor gate circuit according to claim 13, further comprising:

a fifth insulated gate field-effect transistor of the first conductivity type coupled between said first power supply node and said output node, receiving on a gate thereof the output. signal of said second control inverter.

16. The semiconductor gate circuit according to claim 12, further comprising a fourth insulated gate field-effect transistor of the second conductivity type coupled between said first node and a second power supply supplying a voltage at the second logical level, receiving on a gate thereof the output signal of said first control inverter.

17. The semiconductor gate circuit according to claim 13, further comprising:

a fifth insulated gate field-effect transistor of the first conductivity type coupled between said second node and said first power supply node, receiving on a gate thereof the output signal of said second control inverter.

18. A semiconductor gate circuit comprising:

an input node;

an output node; and first and second insulated gate field-effect transistors of a first conductivity type connected in series between a first power supply node supplying a first power supply voltage and said output node, and made conductive when a potential on said input node is at a second power supply voltage level, said first insulated gate field-effect transistor having a threshold voltage larger in absolute value than that of said second insulated gate field-effect transistor, and said first insulated gate field-effect transistor having a current driving capability larger than that of said second insulated gate field-effect transistor under the condition of the same voltage applied between each respective gate and each respective source; and a third insulated gate field-effect transistor of a second conductivity type electrically connected between said output node and a second power supply node supplying the second power supply voltage, and made conductive when the potential on said input node is at the first power supply voltage level, said third insulated gate field-effect transistor having a threshold voltage smaller in absolute value than that of said first insulated gate field-effect transistor.

* * * * *